United States Patent
Nishio et al.

(10) Patent No.: US 12,298,547 B2
(45) Date of Patent: *May 13, 2025

(54) FOLDABLE DISPLAY

(71) Applicant: TOYOBO CO., LTD., Osaka (JP)

(72) Inventors: Shotaro Nishio, Tsuruga (JP); Kiwamu Kawai, Tsuruga (JP); Akira Shimizu, Tsuruga (JP)

(73) Assignee: TOYOBO CO., LTD., Osaka (JP)

( * ) Notice: Subject to any disclaimer, the term of this patent is extended or adjusted under 35 U.S.C. 154(b) by 675 days.

This patent is subject to a terminal disclaimer.

(21) Appl. No.: 17/615,433

(22) PCT Filed: May 15, 2020

(86) PCT No.: PCT/JP2020/019485
§ 371 (c)(1),
(2) Date: Nov. 30, 2021

(87) PCT Pub. No.: WO2020/241313
PCT Pub. Date: Dec. 3, 2020

(65) Prior Publication Data
US 2022/0236468 A1    Jul. 28, 2022

(30) Foreign Application Priority Data
May 30, 2019   (JP) ................. 2019-101025

(51) Int. Cl.
*G02B 5/30*   (2006.01)
*G09F 9/30*   (2006.01)
(52) U.S. Cl.
CPC ........... *G02B 5/3016* (2013.01); *G02B 5/305* (2013.01); *G02B 5/3083* (2013.01); *G09F 9/301* (2013.01)

(58) Field of Classification Search
CPC ...... G02B 5/30; G02B 5/3025; G02B 5/3033; G02B 5/3041; G02B 5/305; G02B 5/3083;
(Continued)

(56) References Cited

U.S. PATENT DOCUMENTS 4,561,724 A   12/1985  Otaki et al.
5,429,855 A    7/1995  Kotani et al.
(Continued)

FOREIGN PATENT DOCUMENTS

CN    1760703 A    4/2006
CN    1839176 A    9/2006
(Continued)

OTHER PUBLICATIONS

European Patent Office, Extended European Search Report in European Application No. 20815504.4 (May 15, 2023).
(Continued)

*Primary Examiner* — Derek S. Chapel
*Assistant Examiner* — Adam W Booher
(74) *Attorney, Agent, or Firm* — Leydig, Voit & Mayer, Ltd.

(57) ABSTRACT

Provided is a foldable display excellent in mass productivity, and free of a risk of causing distortion in an image displayed at a folding portion thereof after being repeatedly folded. The foldable display includes at least: a surface protective film; a polarizer; and a retardation layer, wherein the surface protective film is a polyester film satisfying the following conditions and having a thickness of from 10 μm to 80 μm: (1) a refractive index in a bending direction is from 1.590 to 1.620; (2) a refractive index in a folding portion direction is from 1.670 to 1.700; (3) a refractive index in a thickness direction is 1.520 or less; and (4) a density is 1.380 g/cm³ or more, wherein the bending direction refers to a direction (Continued)

orthogonal to a folding portion of the polyester film at a time when the polyester film is folded.

7 Claims, 1 Drawing Sheet

(58) Field of Classification Search
CPC ... G02B 5/3016; G02B 1/14; G02F 1/133528; G02F 1/133541; G02F 1/133638; G09F 9/301

See application file for complete search history.

(56) References Cited

U.S. PATENT DOCUMENTS

| | | | |
|---|---|---|---|
| 5,833,880 A | 11/1998 | Siemensmeyer et al. | |
| 11,899,167 B2 * | 2/2024 | Nishio | H10K 77/111 |
| 11,934,226 B2 * | 3/2024 | Nishio | H10K 59/8791 |
| 11,939,499 B2 * | 3/2024 | Nishio | C08J 7/046 |
| 11,997,916 B2 * | 5/2024 | Nishio | H10K 77/111 |
| 2002/0034709 A1 | 3/2002 | Fukuda et al. | |
| 2002/0036285 A1 | 3/2002 | Prechtl et al. | |
| 2002/0146518 A1 | 10/2002 | Kusume et al. | |
| 2002/0167111 A1 | 11/2002 | Tsunekawa et al. | |
| 2003/0072893 A1 | 4/2003 | Nakano et al. | |
| 2004/0028925 A1 | 2/2004 | Kusume et al. | |
| 2004/0037978 A1 | 2/2004 | Tsubaki et al. | |
| 2004/0075080 A1 | 4/2004 | Prechtl et al. | |
| 2004/0212767 A1 | 10/2004 | Sasaki et al. | |
| 2005/0099562 A1 | 5/2005 | Nishikouji et al. | |
| 2006/0077320 A1 | 4/2006 | Hata et al. | |
| 2006/0210709 A1 | 9/2006 | Shutou | |
| 2006/0227439 A1 | 10/2006 | Taki et al. | |
| 2008/0193747 A1 | 8/2008 | MacDonald et al. | |
| 2008/0233312 A1 | 9/2008 | Nakamura et al. | |
| 2009/0068472 A1 | 3/2009 | Umemoto et al. | |
| 2009/0137761 A1 | 5/2009 | Irisawa et al. | |
| 2009/0247782 A1 | 10/2009 | Irisawa et al. | |
| 2009/0269513 A1 | 10/2009 | Nishiyama et al. | |
| 2009/0275742 A1 | 11/2009 | Sano et al. | |
| 2011/0315306 A1 | 12/2011 | Goto et al. | |
| 2012/0037928 A1 | 2/2012 | Shim et al. | |
| 2012/0052197 A1 | 3/2012 | Sawada et al. | |
| 2012/0055607 A1 | 3/2012 | Kitagawa et al. | |
| 2012/0055608 A1 | 3/2012 | Kitagawa et al. | |
| 2012/0055621 A1 | 3/2012 | Goto et al. | |
| 2012/0055622 A1 | 3/2012 | Kitagawa et al. | |
| 2012/0055623 A1 | 3/2012 | Kitagawa et al. | |
| 2012/0056211 A1 | 3/2012 | Kitagawa et al. | |
| 2012/0056340 A1 | 3/2012 | Kitagawa et al. | |
| 2012/0057104 A1 | 3/2012 | Kitagawa et al. | |
| 2012/0057107 A1 | 3/2012 | Kitagawa et al. | |
| 2012/0057231 A1 | 3/2012 | Goto et al. | |
| 2012/0057232 A1 | 3/2012 | Goto et al. | |
| 2012/0058291 A1 | 3/2012 | Kitagawa et al. | |
| 2012/0058321 A1 | 3/2012 | Goto et al. | |
| 2012/0107605 A1 | 5/2012 | Ozawa et al. | |
| 2012/0229732 A1 | 9/2012 | Koike et al. | |
| 2012/0327512 A1 | 12/2012 | Goto et al. | |
| 2013/0088859 A1 | 4/2013 | Wang | |
| 2013/0100529 A1 | 4/2013 | Kitagawa et al. | |
| 2013/0114139 A1 | 5/2013 | Kitagawa et al. | |
| 2014/0016198 A1 | 1/2014 | Sawada et al. | |
| 2014/0044947 A1 | 2/2014 | Sawada et al. | |
| 2014/0104519 A1 | 4/2014 | Murata et al. | |
| 2014/0186568 A1 | 7/2014 | Kitagawa et al. | |
| 2015/0183199 A1 | 7/2015 | Kitagawa et al. | |
| 2015/0369981 A1 | 12/2015 | Takeda et al. | |
| 2016/0025910 A1 | 1/2016 | Sawada et al. | |
| 2016/0035801 A1 | 2/2016 | Kim | |
| 2016/0054494 A1 | 2/2016 | Kitagawa et al. | |
| 2016/0062012 A1 | 3/2016 | Shin et al. | |
| 2016/0103249 A1 | 4/2016 | Sato et al. | |
| 2016/0103258 A1 | 4/2016 | Kitagawa et al. | |
| 2016/0318845 A1 | 11/2016 | Katoh et al. | |
| 2017/0131445 A1 | 5/2017 | Koyama | |
| 2017/0276840 A1 | 9/2017 | Horio et al. | |
| 2018/0088392 A1 | 3/2018 | Park et al. | |
| 2018/0095211 A1 * | 4/2018 | Lee | G02F 1/133634 |
| 2018/0179395 A1 | 6/2018 | Seo et al. | |
| 2018/0217639 A1 | 8/2018 | Jones et al. | |
| 2018/0356564 A1 | 12/2018 | Jeong et al. | |
| 2019/0004367 A1 | 1/2019 | Koike et al. | |
| 2019/0177577 A1 | 6/2019 | Yamasaki et al. | |
| 2019/0219740 A1 | 7/2019 | Horio et al. | |
| 2019/0255807 A1 | 8/2019 | Isojima et al. | |
| 2020/0142116 A1 * | 5/2020 | Lee | C09J 163/10 |
| 2020/0269559 A1 | 8/2020 | Inagaki et al. | |
| 2021/0041603 A1 | 2/2021 | Kanke et al. | |
| 2021/0132663 A1 | 5/2021 | Hongo et al. | |
| 2021/0179794 A1 | 6/2021 | Yoshino et al. | |
| 2021/0179901 A1 | 6/2021 | Fujita et al. | |
| 2022/0085307 A1 | 3/2022 | Nishio et al. | |
| 2022/0164003 A1 | 5/2022 | Nishio et al. | |
| 2022/0213350 A1 | 7/2022 | Nishio et al. | |
| 2022/0214486 A1 | 7/2022 | Isojima et al. | |
| 2022/0227950 A1 | 7/2022 | Nishio et al. | |
| 2022/0236467 A1 * | 7/2022 | Nishio | H10K 59/8793 |
| 2022/0246069 A1 | 8/2022 | Nishio et al. | |
| 2022/0252763 A1 | 8/2022 | Nishio et al. | |
| 2022/0275159 A1 * | 9/2022 | Yamaguchi | H04M 1/0268 |
| 2022/0389269 A1 * | 12/2022 | Yamaguchi | C08F 290/061 |
| 2023/0122628 A1 | 4/2023 | Matsumura et al. | |
| 2023/0192974 A1 | 6/2023 | Nishio et al. | |

FOREIGN PATENT DOCUMENTS

| | | |
|---|---|---|
| CN | 1967294 A | 5/2007 |
| CN | 101160674 A | 4/2008 |
| CN | 101923245 A | 12/2010 |
| CN | 104067352 A | 9/2014 |
| CN | 104159735 A | 11/2014 |
| CN | 105321978 A | 2/2016 |
| CN | 106488839 A | 3/2017 |
| CN | 107867030 A | 4/2018 |
| CN | 108349228 A | 7/2018 |
| CN | 109789691 A | 5/2019 |
| EP | 0112488 A1 | 7/1984 |
| EP | 3922668 A1 | 12/2021 |
| EP | 3923263 A1 | 12/2021 |
| EP | 3978554 A1 | 4/2022 |
| EP | 3978966 A1 | 4/2022 |
| EP | 4119599 A1 | 1/2023 |
| JP | S60-097323 A | 5/1985 |
| JP | S60-203422 A | 10/1985 |
| JP | S61-009619 A | 1/1986 |
| JP | S63-001357 B2 | 1/1988 |
| JP | S63-301850 A | 12/1988 |
| JP | H05-049710 B2 | 7/1993 |
| JP | H10-316783 A | 12/1998 |
| JP | H11-513360 A | 11/1999 |
| JP | 2000-063538 A | 2/2000 |
| JP | 2000-177001 A | 6/2000 |
| JP | 2001-324603 A | 11/2001 |
| JP | 2001-350021 A | 12/2001 |
| JP | 2002-030042 A | 1/2002 |
| JP | 2002-178400 A | 6/2002 |
| JP | 2002-229039 A | 8/2002 |
| JP | 2002-265541 A | 9/2002 |
| JP | 2002-303722 A | 10/2002 |
| JP | 2002-308832 A | 10/2002 |
| JP | 2002-317013 A | 10/2002 |
| JP | 2003-089151 A | 3/2003 |
| JP | 2003-520878 A | 7/2003 |
| JP | 2004-204190 A | 7/2004 |
| JP | 2004-529220 A | 9/2004 |
| JP | 2004-299101 A | 10/2004 |
| JP | 2005-154566 A | 6/2005 |
| JP | 2005-263789 A | 9/2005 |
| JP | 2005-331909 A | 12/2005 |
| JP | 2006-187880 A | 7/2006 |
| JP | 2006-285197 A | 10/2006 |
| JP | 2007-016207 A | 1/2007 |
| JP | 2007-076839 A | 3/2007 |
| JP | 2007-094071 A | 4/2007 |

(56) References Cited

FOREIGN PATENT DOCUMENTS

| | | |
|---|---|---|
| JP | 2007-510946 A | 4/2007 |
| JP | 2007-119415 A | 5/2007 |
| JP | 2007-121721 A | 5/2007 |
| JP | 2007-126628 A | 5/2007 |
| JP | 2007-133184 A | 5/2007 |
| JP | 2007-138138 A | 6/2007 |
| JP | 2007-140465 A | 6/2007 |
| JP | 2007-156439 A | 6/2007 |
| JP | 2007-186430 A | 7/2007 |
| JP | 2008-070708 A | 3/2008 |
| JP | 2008-149577 A | 7/2008 |
| JP | 2008-242231 A | 10/2008 |
| JP | 2009-093074 A | 4/2009 |
| JP | 2009109831 A * | 5/2009 |
| JP | 2009-149066 A | 7/2009 |
| JP | 2009-199087 A | 9/2009 |
| JP | 2010-168570 A | 8/2010 |
| JP | 2010-228391 A | 10/2010 |
| JP | 2011-002816 A | 1/2011 |
| JP | 2011-154134 A | 8/2011 |
| JP | 2012-073563 A | 4/2012 |
| JP | 2012-107080 A | 6/2012 |
| JP | 2012-214726 A | 11/2012 |
| JP | 2013-033248 A | 2/2013 |
| JP | 2013-052561 A | 3/2013 |
| JP | 2013-101328 A | 5/2013 |
| JP | 2013-114131 A | 6/2013 |
| JP | 2013-184431 A | 9/2013 |
| JP | 2013-210624 A | 10/2013 |
| JP | 2014-065887 A | 4/2014 |
| JP | 2014-186210 A | 10/2014 |
| JP | 2014-206682 A | 10/2014 |
| JP | 2014-221560 A | 11/2014 |
| JP | 2015-007702 A | 1/2015 |
| JP | 2015-030157 A | 2/2015 |
| JP | 2015-064418 A | 4/2015 |
| JP | 2015-129210 A | 7/2015 |
| JP | 2015-163596 A | 9/2015 |
| JP | 2015-174357 A | 10/2015 |
| JP | 2015-184664 A | 10/2015 |
| JP | 2015-232120 A | 12/2015 |
| JP | 2016-004055 A | 1/2016 |
| JP | 2016-075869 A | 5/2016 |
| JP | 2016-090925 A | 5/2016 |
| JP | 2016-155124 A | 9/2016 |
| JP | 2017-033033 A | 2/2017 |
| JP | 2017-033034 A | 2/2017 |
| JP | 2017-067819 A | 4/2017 |
| JP | 2017-134416 A | 8/2017 |
| JP | 2018-010086 A | 1/2018 |
| JP | 2018-022060 A | 2/2018 |
| JP | 2018-027995 A | 2/2018 |
| JP | 2018-059070 A | 4/2018 |
| JP | 6307205 B1 | 4/2018 |
| JP | 2018-072663 A | 5/2018 |
| JP | 2018-124367 A | 8/2018 |
| JP | 2018-202696 A | 12/2018 |
| JP | 2018-538572 A | 12/2018 |
| JP | 2019-008026 A | 1/2019 |
| KR | 10-2000-0023039 A | 4/2000 |
| KR | 10-2002-0029377 A | 4/2002 |
| KR | 10-1713277 B1 | 3/2017 |
| TW | 201733807 A | 10/2017 |
| TW | 201839476 A | 11/2018 |
| WO | WO 2001/053384 A1 | 7/2001 |
| WO | WO 2002/062873 A1 | 8/2002 |
| WO | WO 2005/045485 A1 | 5/2005 |
| WO | WO 2006/100830 A1 | 9/2006 |
| WO | WO 2010/100917 A1 | 9/2010 |
| WO | WO 2011/058774 A1 | 5/2011 |
| WO | WO 2012/121042 A1 | 9/2012 |
| WO | WO 2013/100042 A1 | 7/2013 |
| WO | WO 2014/203894 A1 | 12/2014 |
| WO | WO 2016/010134 A1 | 1/2016 |
| WO | WO 2017/115736 A1 | 7/2017 |
| WO | WO 2017/200042 A1 | 11/2017 |
| WO | WO 2018/003963 A1 | 1/2018 |
| WO | WO 2018/070132 A1 | 4/2018 |
| WO | WO 2018/150940 A1 | 8/2018 |
| WO | WO 2018/159285 A1 | 9/2018 |
| WO | WO 2019/026753 A1 | 2/2019 |
| WO | WO 2019/202992 A1 | 10/2019 |
| WO | WO 2019/216172 A1 | 11/2019 |
| WO | WO 2020/162119 A1 | 8/2020 |
| WO | WO 2020/162120 A1 | 8/2020 |
| WO | WO 2020/241278 A1 | 12/2020 |
| WO | WO 2020/241279 A1 | 12/2020 |
| WO | WO 2020/241280 A1 | 12/2020 |
| WO | WO 2020/241281 A1 | 12/2020 |
| WO | WO 2020/241312 A1 | 12/2020 |
| WO | WO 2021/010158 A1 | 1/2021 |
| WO | WO 2021/010159 A1 | 1/2021 |

OTHER PUBLICATIONS

Yang, "Review of Operating Principle and Performance of Polarizer-Free Reflective Liquid-Crystal Displays," *Journal of the Society for Information Display*, 16(1): 117-124 (2012).
Wikipedia, "Cyclic Olefin Copolymer" (2023) [accessed at https://en.wikipedia.org/wiki/Cyclic_olefin_copolymer].
European Patent Office, Extended European Search Report in European Patent Application No. 20814476.6 (Jun. 12, 2023).
European Patent Office, Extended European Search Report in European Patent Application No. 20815401.3 (Jun. 12, 2023).
European Patent Office, Extended European Search Report in European Patent Application No. 20752680.7 (Oct. 26, 2022).
European Patent Office, Extended European Search Report in European Patent Application No. 20753154.2 (Oct. 10, 2022).
European Patent Office, Extended European Search Report in European Application No. 20815576.2 (May 9, 2023).
Japanese Patent Office, International Search Report in International Patent Application No. PCT/JP2020/001043 (Mar. 24, 2020).
Japanese Patent Office, International Search Report in International Patent Application No. PCT/JP2020/001044 (Mar. 17, 2020).
Japan Patent Office, Office Action in Japanese Patent Application No. 2020-086715 (Oct. 17, 2023).
Lub et al., "The synthesis of liquid-crystalline diacrylates derived from cyclohexane units," *Recl. Trav. Chim. Pays-Bas*, 115(6): 321-328 (1996).
Japanese Patent Office, International Search Report in International Patent Application No. PCT/JP2020/019484 (Jul. 28, 2020).
Japanese Patent Office, International Search Report in International Patent Application No. PCT/JP2020/019485 (Jul. 14, 2020).
Japanese Patent Office, International Search Report in International Patent Application No. PCT/JP2020/019264 (Jul. 21, 2020).
Japanese Patent Office, International Search Report in International Patent Application No. PCT/JP2020/019265 (Jul. 21, 2020).
Japanese Patent Office, International Search Report in International Patent Application No. PCT/JP2020/019266 (Jul. 28, 2020).
Japanese Patent Office, International Search Report in International Patent Application No. PCT/JP2020/019267 (Jul. 21, 2020).
Japanese Patent Office, International Search Report in International Patent Application No. PCT/JP2020/025671 (Sep. 15, 2020).
Japanese Patent Office, International Search Report in International Patent Application No. PCT/JP2020/025672 (Sep. 15, 2020).
European Patent Office, Extended European Search Report in European Patent Application No. 20840513.4 (Jul. 3, 2023).
European Patent Office, Extended European Search Report in European Patent Application No. 20840729.6 (Jul. 3, 2023).
U.S. Appl. No. 17/429,119, filed Aug. 6, 2021.
U.S. Appl. No. 17/429,147, filed Aug. 6, 2021.
U.S. Appl. No. 17/614,154, filed Nov. 24, 2021.
U.S. Appl. No. 17/614,201, filed Nov. 24, 2021.
U.S. Appl. No. 17/614,228, filed Nov. 24, 2021.
U.S. Appl. No. 17/614,260, filed Nov. 24, 2021.
U.S. Appl. No. 17/615,426, filed Nov. 30, 2021.
U.S. Appl. No. 17/625,291, filed Jan. 6, 2022.
U.S. Appl. No. 17/625,302, filed Jan. 6, 2022.

(56) References Cited

OTHER PUBLICATIONS

U.S. Appl. No. 18/643,154, filed Apr. 23, 2024.
Korean Intellectual Property Office, Office Action in Korean Patent Application No. 10-2021-7041987 (Mar. 18, 2025).

* cited by examiner

FOLDABLE DISPLAY

TECHNICAL FIELD

The present invention relates to a foldable display that hardly causes image distortion due to deformation of a film even when repeatedly folded.

BACKGROUND ART

Becoming thinner and lighter, a mobile device, such as a smartphone, has become widely prevalent. While being required to have a variety of functions, the mobile device is also required to be convenient in use. It is taken for granted that a prevailing mobile device can be operated with one hand for simple tasks, and can be put into a clothes pocket. Thus, such mobile device needs to have a small screen size, such as about 6 inches.

Meanwhile, a tablet device having a screen size of from 7 inches to 10 inches is intended for use not only for video content and music, but also for business and drawing purposes, reading, and the like, and thus has a high level of functionality. However, the tablet device cannot be operated with one hand and is not particularly portable, leaving some issues in regard to convenience.

In order to meet the requirements described above, there is a proposal of a technique involving making a compact device by connecting a plurality of displays (see PTL 1). However, due to the remaining bezel portion, the image is cut up, and the visibility becomes low. Thus, this technique is not commonly used.

In recent years, a mobile device including a flexible display or a foldable display has been proposed. This technique enables one to conveniently carry a mobile device including a large-screen display without image-cutting problems.

The related-art display and mobile device that have no folding structure can be protected by a non-flexible material, such as glass, applied to the surface of the display. However, a foldable display using a single screen that spans over a folding portion needs to be protected by a flexible and surface-protectable hard coating film or the like. However, for example, there has been a problem in that the foldable display is repeatedly folded at a certain point that is a folding portion, and hence the film at the point deforms over time, causing image distortion on the display. In addition, not only a surface protective film, films are used in various portions of the foldable display, such as a polarizing plate, a retardation plate, a touchscreen substrate, a substrate of a display cell of organic EL or the like, and a back-surface protective member, and these films have also been required to have durability against repeated folding.

There is also a proposal of a technique involving partially altering a film thickness (see PTL 2). However, this method is not suitable for mass production.

In addition, there is also a proposal of a technique involving adjusting a refractive index of a polyester film in its bending direction (see PTL 3). However, there has been a problem in that, as the refractive index in the bending direction is decreased, pencil hardness at the time of hard coating application reduces, resulting in a reduction in function of protecting the surface of the display. There has also been a problem in that, as the refractive index in one direction is decreased, although deformation at the time of folding is ameliorated, uniaxial orientation of a folding direction is enhanced, with the result that a folding portion is cracked or fractured.

CITATION LIST

Patent Literature

PTL 1: JP 2010-228391 A
PTL 2: JP 2016-155124 A
PTL 3: WO 2018/150940 A1

SUMMARY OF INVENTION

Technical Problem

The present invention is intended to solve the problems that arise in related-art display members as described above, and is intended to provide a foldable display excellent in mass productivity, and free of a risk of causing distortion in an image displayed at a folding portion thereof after being repeatedly folded.

Solution to Problem

Specifically, the present invention includes the following configurations.
Item 1.
A foldable display including at least:
a surface protective film;
a polarizer; and
a retardation layer,
wherein the surface protective film is a polyester film satisfying the following conditions and having a thickness of from 10 μm to 80 μm;
  (1) a refractive index in a bending direction is from 1.590 to 1.620;
  (2) a refractive index in a folding portion direction is from 1.670 to 1.700;
  (3) a refractive index in a thickness direction is 1.520 or less; and
  (4) a density is 1.380 g/cm$^3$ or more,
  wherein the bending direction refers to a direction orthogonal to a folding portion of the polyester film at a time when the polyester film is folded.
Item 2.
The foldable display according to Item 1, wherein the polyester film has an elastic modulus in the bending direction of 2.7 GPa or less, and an elastic modulus in the folding portion direction of 4.5 GPa or more.
Item 3.
The foldable display according to Item 1 or 2, further including a hard coating layer on at least one surface of the polyester film, wherein the hard coating layer is positioned at least on a surface of the foldable display.
Item 4.
The foldable display according to Item 3, wherein the polyester film having the hard coating layer on at least one surface thereof has a total light transmittance of 85% or more and a haze of 3% or less.
Item 5.
The foldable display according to any one of Items 1 to 4, wherein the surface protective film is a single surface protective film continuous across a folding portion of the foldable display.

Item 6.

The foldable display according to any one of Items 1 to 5, wherein the retardation plate is a quarter-λ plate.

Item 7.

A mobile device including the foldable display of Item 6.

Advantageous Effects of Invention

While the foldable display of the present invention maintains mass productivity, the surface protective film is free of occurrence of a crack at the folding portion thereof, does not cause deformation after being repeatedly folded, and does not cause image distortion at the folding portion of the display. The mobile device including the foldable display using the surface protective film as described above provides a beautiful image, is rich in functionality, and is excellent in convenience, such as portability.

DESCRIPTION OF EMBODIMENTS (Display)

Figure 1:
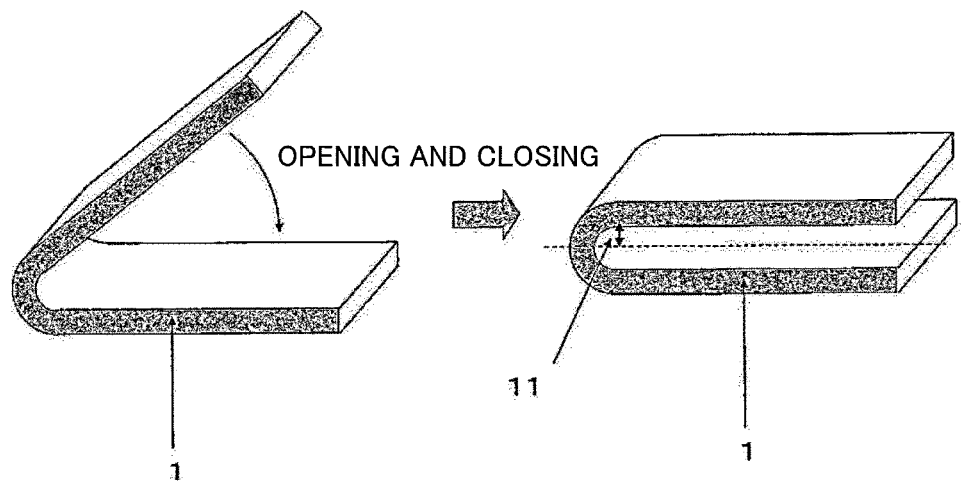
FIG. 1 is a schematic view for illustrating a bend radius at a time when a foldable display in the present invention is folded.

The term "display" as used in the present invention refers to display devices in general. There are several kinds of displays such as an LCD, an organic EL display, an inorganic EL display, an LED, and an FED. Of those, an LCD, an organic EL display, and an inorganic EL display, each of which has a foldable structure, are preferred. In particular, an organic EL display and an inorganic EL display, each of which can reduce a layer structure, are more preferred, and an organic EL display, which has a wide color gamut, is even more preferred.

(Foldable Display)

A foldable display is one continuous display that can be folded, for example, in half when carried. The foldable display can be reduced in size by half by being folded, to thereby improve portability. The bend radius of the foldable display is preferably 5 mm or less, more preferably 3 mm or less. When the bend radius is 5 mm or less, thinning in a folded state can be achieved. The bend radius may be said to be desirably as small as possible. However, as the bend radius becomes smaller, a fold mark becomes more liable to be formed. The bend radius is preferably 0.1 mm or more, but may be 0.5 mm or more, or may be 1 mm or more. Even when the bend radius is 1 mm, practically sufficient thinning can be achieved at the time of carrying. The bend radius of a device when folded is measured at a point marked with reference numeral 11 in the schematic view of FIG. 1, and means the inner radius of the folding portion of the device when folded. A surface protective film to be described later may be located on the outer side or the inner side of the folded foldable display.

In addition, the foldable display may be folded in thirds or fourths, or may be of a rolling type called rollable, and all of these fall within the range of the term "foldable display" as used in the present invention.

A polyester film for a foldable display to be used in the present invention, and a hard coating film having a hard coating layer on at least one surface of the polyester film may be used in any portions of the constituent members of a foldable display. A typical configuration of the foldable display and portions thereof in which the polyester film in the present invention and the hard coating film may be used are described below by taking an organic EL display as an example. The hard coating film for a display is hereinafter sometimes referred to simply as "hard coating film in the present invention."

(Foldable Organic EL Display)

A foldable organic EL display essentially includes an organic EL module, and further includes, as required, a circularly polarizing plate, a touchscreen module, a surface protective film, a back-surface protective film, and the like.

(Organic EL Module)

A general configuration of the organic EL module is formed of an electrode/an electron transport layer/a light-emitting layer/a hole transport layer/a transparent electrode.

A foldable display of the present invention includes a surface protective film. The surface protective film has a function of preventing a circuit in the organic EL module or the touchscreen module from being broken when an impact is applied to the display from above. The surface protective film encompasses one called a "cover window" surface protective film, which is built into the outermost surface of the display, and one called an "aftermarket" surface protective film, which a user himself/herself can bond, peel off, and exchange, but the polyester film and the hard coating film in the present invention can be suitably used as both of those surface protective films. It is preferred that the polyester film to be used for those surface protective films have a thickness of from 10 µm to 80 µm and satisfy the following characteristics (1) to (4):

(1) a refractive index in a bending direction is from 1.590 to 1.620;

(2) a refractive index in a folding portion direction is from 1.670 to 1.700;

(3) a refractive index in a thickness direction is 1.520 or less; and (4) a density is 1.380 g/cm$^3$ or more, wherein the bending direction refers to a direction orthogonal to a folding portion of the polyester film at a time when the polyester film is folded.

The foldable display of the present invention does not need to use both of the cover window and aftermarket surface protective films, and may include at least only one of the surface protective films. In addition, the polyester film having the above-mentioned specific characteristics only needs to be used for at least one of the cover window and aftermarket surface protective films, and is preferably used for both the surface protective films.

The polyester film to be used for the surface protective film may be a monolayered film formed of one or more kinds of polyester resins. When two or more kinds of polyester resins are used, the polyester film may be a multilayered film or an ultra-multilayered lamination film having a repeating structure.

Examples of the polyester resin to be used in the polyester film include polyethylene terephthalate, polybutylene terephthalate, polyethylene-2,6-naphthalate, and a polyester film formed of a copolymer containing the component of any such resin as a main component. Of those, a stretched polyethylene terephthalate film is particularly preferred from the viewpoints of, for example, mechanical properties, heat resistance, transparency, and price.

When the polyester copolymer is used in the polyester film, examples of the dicarboxylic acid component of the polyester include: aliphatic dicarboxylic acids, such as adipic acid and sebacic acid; aromatic dicarboxylic acids, such as terephthalic acid, isophthalic acid, phthalic acid, and 2,6-naphthalene dicarboxylic acid; and multifunctional carboxylic acids, such as trimellitic acid and pyromellitic acid. In addition, examples of the glycol component of the polyester include: aliphatic glycols, such as ethylene glycol, diethylene glycol, 1,4-butanediol, propylene glycol, and neopentyl glycol; aromatic glycols, such as p-xylene glycol; alicyclic glycols, such as 1,4-cyclohexanedimethanol; and polyethylene glycols each having an average molecular weight of from 150 to 20,000. The mass ratio of the copolymer component of the copolymer is preferably less than 20 mass %. A case in which the mass ratio is less than 20 mass % is preferred because film strength, transparency, and heat resistance are retained.

In addition, in the production of the polyester film, at least one kind of resin pellet preferably has a limiting viscosity of from 0.50 dl/g to 1.0 dl/g. A case in which the limiting viscosity is 0.50 dl/g or more is preferred because the impact resistance of a film to be obtained is improved, and hence breakage of a circuit in the display due to an external impact hardly occurs. Meanwhile, a case in which the limiting viscosity is 1.00 dl/g or less is preferred because film production can be easily operated in a stable manner without an excessively large increase in filtration pressure of molten fluid.

The polyester film preferably has a thickness of from 10 µm to 80 µm, more preferably from 25 µm to 75 µm. When the thickness is 10 µm or more, a pencil hardness improvement effect and an impact resistance improvement effect are exhibited. When the thickness is 80 µm or less, there is an advantage in terms of weight reduction, and excellent flexibility, processability, handleability, and the like are obtained.

The surface of the polyester film may be smooth or uneven. However, decreased optical properties due to unevenness are not preferred because the film is used for covering the surface of a display. A haze is preferably 3% or less, more preferably 2% or less, most preferably 1% or less. When the haze is 3% or less, the visibility of an image can be improved. The lower limit of the haze is desirably as small as possible, but is preferably 0.1% or more from the viewpoint of stable production, and may be 0.3% or more.

From the purpose of reducing the haze as described above, the unevenness of the film surface is preferably not so large. However, to provide the film, with moderate slipperiness for the viewpoint of handleability, unevenness may be formed on the film surface by blending particles into the polyester resin layer serving as the surface layer, or by coating the polyester resin layer with a particle-containing coating layer during a film formation process.

A known method may be adopted as a method of blending particles into the polyester resin layer. For example, the particles, which may be added in any stage of polyester production, may be preferably added in the form, of a slurry prepared by dispersing the particles in, for example, ethylene glycol in the stage of esterification, in a stage after the completion of a transesterification reaction, or in a stage before the start of a polycondensation reaction to advance the polycondensation reaction. Alternatively, the particles may be added by, for example, a method of blending a slurry prepared by dispersing the particles in, for example, ethylene glycol or water with a polyester material by using a kneading extruder with a vent, or a method of blending dry particles with a polyester material by using a kneading extruder.

In particular, preferred is a method involving: homogeneously dispersing the aggregates of inorganic particles in a monomer solution, which is part of a polyester material; then filtering the dispersion; and adding the filtrate to the remainder of the polyester material before, during, or after an esterification reaction. This method, due to the low viscosity of the monomer solution, enables homogeneous dispersion of particles and high-precision filtration of the slurry in a simple manner, while ensuring excellent particle dispersibility and low likeliness of the occurrence of new aggregates when the particles are added to the remainder of the polyester material. From such viewpoints, it is particularly preferred to add the particles to the remainder of the polyester material in a low-temperature state before the esterification reaction.

In addition, the number of protrusions on the surface of the film may be further reduced by a method involving preparing a particle-containing polyester beforehand, and then subjecting pellets of the particle-containing polyester and particle-free pellets to kneading extrusion or the like (master batch method).

In addition, the polyester film may contain various additives within the range in which a preferred range of a total light transmittance is maintained. Examples of the additives include an antistatic agent, a UV absorber, and a stabilizer.

The polyester film has a total light transmittance of preferably 85% or more, more preferably 87% or more. When the transmittance is 85% or more, visibility can be sufficiently ensured. The total light transmittance of the polyester film may be said to be desirably as high as possible, but is preferably 99% or less from the viewpoint of stable production, and may be 97% or less.

The maximum heat shrinkage ratio of the polyester film after heat treatment at 150° C. for 30 minutes is preferably 6% or less, more preferably 5% or less. When the heat shrinkage ratio is 6% or less, a flat surface failure such as curling or waviness at the time of HC processing can be suppressed. The heat shrinkage ratio may be said to be desirably as low as possible, but is preferably −1% or more, more preferably 0% or more. The minus in this case means expansion after heating, and the flat surface failure may also occur when the heat shrinkage ratio is less than −1%.

When a hard coating layer is arranged on the polyester film to be used in the present invention, a sufficient pencil hardness can be imparted to the hard coating layer. After the lamination of a hard coating layer on a related-art polyester film, it is conceived that, in pencil hardness evaluation of the pencil hardness of the hard coating film, the pencil hardness is reduced owing to deformation of the film in its thickness direction. In the present invention, when an indentation depth after test force unloading in the film thickness direction with a dynamic ultramicrohardness meter to be described later is set to fall within a specific range, a high hardness can be achieved in the pencil hardness evaluation of the hard coating film. The indentation depth after test force unloading in the film thickness direction is preferably 1.5 µm or less, more preferably 1.4 µm or less, still more preferably 1.3 µm or less. When the indentation depth after test force unloading (final deformation amount under loading) is 1.5 µm or less, in the pencil hardness evaluation of the hard coating film after the lamination of the hard coating layer, the film is hardly deformed in its thickness direction, and hence the pencil hardness can be increased. When the pencil hardness of the hard coating film can be increased, the surface of the display hardly has a scratch or a dent, and hence the visibility of the display is improved. The indentation depth after test force unloading may be said to be desirably as low as possible, but is preferably 0.3 μm or more, more preferably 0.5 μm or more from the viewpoints of stable production and saturation of the effect.

In order to reduce the indentation depth after test force unloading, it is effective to adjust a refractive index in the thickness direction to 1.520 or less. Means for adjusting the refractive index to 1.520 or less may be exemplified by condition settings, such as adjusting stretching ratios in a bending direction and a folding direction to high ratios, setting stretching temperatures in the bending direction and the folding direction to low temperatures, and setting a heat fixation temperature to a high temperature, within ranges in which other physical properties, and refractive indices in the bending direction and the folding direction, which are described later, can be controlled to preferred ranges.

The elastic modulus of the polyester film in its bending direction is preferably 2.7 GPa or less, more preferably 2.5 GPa or less, still more preferably 2.3 GPa or less. When the elastic modulus in the bending direction is reduced, a stress applied to the hard coating layer at the time of the bending of the hard coating film can be reduced. It may be said that a lower elastic modulus in the bending direction leads to better bendability, but the flatness of the surface of the display is impaired, and hence the elastic modulus in the bending direction is preferably 1.8 GPa or more. The elastic modulus of the polyester film in its folding direction is preferably 4.5 GPa or more, more preferably 4.6 GPa or more, still more preferably 4.7 GPa or more. When the elastic modulus in the folding direction is set to be high, the flatness of the surface of the display can be maintained during the production of the display. The elastic modulus in the folding direction is preferably as high as possible, but is preferably 8.0 GPa or less from the viewpoint of film formability.

The non-hard coating surface of the hard coating film in the present invention may be subjected to surface treatment for improving adhesiveness with an adhesive or a hard coating layer.

Examples of surface treatment methods include: unevenness-forming treatment by sandblasting treatment, solvent treatment, or the like; and oxidation treatment, such as corona discharge treatment, electron beam irradiation treatment, plasma treatment, ozone/UV irradiation treatment, flame treatment, chromic acid treatment, or hot air treatment. Those methods may be used without any particular limitation.

In addition, adhesiveness may also be improved by an adhesion-improving layer, such as an easy-to-adhere layer. Resins such as an acrylic resin, a polyester resin, a polyurethane resin, and a polyether resin may be used for the easy-to-adhere layer without any particular limitation. The easy-to-adhere layer may be formed by a general coating method, preferably a so-called in-line coating formulation.

The above-mentioned polyester film may be produced, for example, through: a polymerization step of homogenously dispersing inorganic particles in a monomer solution, which is part of a polyester material, filtering the dispersion, and then adding the filtrate to the remainder of the polyester material to polymerize a polyester; and a film-forming step of melt-extruding the polyester into a sheet shape through a filter, cooling the sheet, and then stretching the cooled sheet to form a substrate film.

Next, a method of producing the polyester film is described in detail with an example in which pellets of polyethylene terephthalate (hereinafter sometimes referred to as "PET") are used as a material for a substrate film. However, the method is not limited to this example. In addition, the example is not intended to limit the number of layers such as a monolayer structure or a multilayer structure.

After a predetermined proportion of PET pellets are mixed and dried, the mixture is fed to a known extruder for melting and laminating, and extruded from a slit die into a sheet shape, followed by cooling and solidifying the sheet on a casting roll to form an unstretched film. A monolayer may be produced with a single extruder. A multilayered (i.e., including two or more layers) film may be produced by: laminating a plurality of film layers for forming an outermost layer using two or more extruders, a multilayered manifold, or a confluence block (e.g., a confluence block with a square joint); extruding a sheet of two or more layers from a mouthpiece; and cooling the sheet on a casting roll to form an unstretched film.

In this case, it is preferred to perform high-precision filtration to remove foreign matter contained in the resin at any portion of the extruder at which the molten resin is maintained at about 280° C. during melt-extrusion. A filtering medium to be used in the high-precision filtration of the molten resin is not particularly limited, but is preferably a filtering medium of a stainless-steel sintered body because of its excellent performance for removing an aggregate containing Si, Ti, Sb, Ge, or Cu as a main component and organic matter having a high melting point.

Further, the filtering medium, has a filtered particle size (initial filtration efficiency: 95%) of preferably 20 μm or less, particularly preferably 15 μm or less. When the filtered particle size (initial filtration efficiency: 95%) of the filtering medium is more than 20 μm, foreign matter having a size of 20 μm or more cannot be sufficiently removed. Although high-precision filtration of a molten resin using a filtering medium having a filtered particle size (initial filtration efficiency: 95%) of 20 μm or less may reduce productivity, such filtering medium, is preferred from the viewpoint of obtaining a film having fewer protrusions caused by coarse particles.

(With Regard to Refractive Index in Bending Direction)

Figure 2:
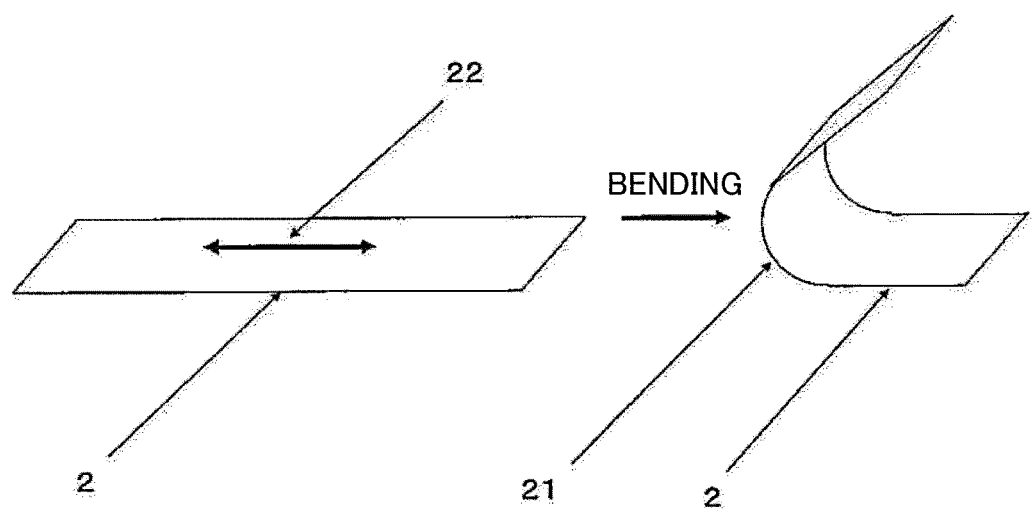
FIG. 2 is a schematic view for illustrating the bending direction of a polyester film for a surface protective film of a foldable display in the present invention.

In the present invention, the refractive index of the polyester film in at least any one of its longitudinal direction (machine direction) and width direction is preferably from 1.590 to 1.620, more preferably from 1.591 to 1.600. In addition, the refractive index of the polyester film in its bending direction is preferably from 1.590 to 1.620, more preferably from 1.591 to 1.600. Herein, as denoted by reference numeral 22 on a polyester film (reference numeral 2) in FIG. 2, the "bending direction" refers to a direction orthogonal to a folding portion (reference numeral 21) assumed in a foldable display application. A case in which the refractive index in at least any one of the longitudinal direction and the width direction is from 1.590 to 1.620 is preferred because deformation at the time of repeated folding is reduced to preclude a risk of reducing the image quality of the foldable display. The refractive index is more preferably from 1.591 to 1.600. Of course, the direction of the refractive index is preferably the above-mentioned bending direction. When the refractive index is 1.590 or more, there is no risk of cracking in the folding portion direction after a bending test to be described later, and as a matter of course, fracture does not occur either. Accordingly, the visibility of the display can be kept satisfactory. The refractive index of the polyester film can be effectively adjusted by adjusting the stretching ratios and the stretching temperatures. In addition, a relaxation step in a stretching direction or multi-stage stretching may be used in order to adjust the refractive index. When the multi-stage stretching is performed, it is preferred that a stretching ratio in a second or later stage be set to be higher than a stretching ratio in a first stage.

Fatigue due to a compressive stress applied to the inside of folding at the time of folding can be reduced by controlling the refractive index of the polyester film in at least any one of its longitudinal direction (machine direction) and width direction within the above-mentioned ranges, more preferably by controlling the refractive index in the bending direction within the above-mentioned ranges. The fatigue due to the compressive stress is considered to occur mainly in a crystalline portion, and a reduction in amount of crystals in the bending direction reduces the fatigue. Accordingly, it is conceived that, when the refractive index is decreased, the amount of crystals oriented in the bending direction is reduced to suppress the compression fatigue.

In addition, a creep phenomenon caused by a tensile stress applied to the outside of folding at the time of folding can be suppressed by reducing the refractive index. Fatigue due to the tensile stress is considered to occur mainly in an amorphous portion, and alignment of molecular chains due to repeatedly applied stress occurs to cause deformation. Presumably, as the number of molecular chains arranged in the bending direction becomes smaller, the deformation caused by the alignment reduces. In addition, as the amount of the amorphous portion becomes smaller, the tensile fatigue can be suppressed more, and hence a higher crystallinity, that is, a higher density is preferred.

In the present invention, the stretching ratio of an unstretched polyester sheet in at least any one of the longitudinal direction (machine direction) and the width direction is set to preferably from 1.2 times to 2.0 times, more preferably from 1.7 times to 2.0 times. In addition, the stretching direction is preferably the above-mentioned bending direction. A case in which the stretching ratio is 1.2 times or more is preferred because no deformation occurs in post-processing, such as hard coating application, and a case in which the stretching ratio is 2.0 times or less is preferred because thickness unevenness is prevented from occurring in the film. A stretching temperature is preferably from 75° C. to 120° C., more preferably from 75° C. to 105° C. Hitherto known means, such as a hot-air heating system, a roll heating system, or an infrared heating system, may be adopted as a heating method at the time of the stretching. When the stretching temperature is set to from 75° C. to 120° C., large thickness unevenness due to the stretching at the above-mentioned stretching ratio can be prevented. In addition, when the stretching is performed at as low a temperature as possible within a range in which large thickness unevenness is prevented from occurring as described above, the refractive index in the thickness direction can be reduced.

(With Regard to Refractive Index in Folding Portion Direction)

The refractive index in the direction orthogonal to the above-mentioned direction in which the refractive index of the polyester film is from 1.590 to 1.620 is preferably from 1.670 to 1.700. That is, the refractive index in the direction (folding portion direction) orthogonal to the bending direction is preferably from 1.670 to 1.700. When the refractive index is set to from 1.670 to 1.700, deformation at the time of folding in the bending direction can be reduced. When the refractive index is set to 1.700 or less, cracking or fracturing in the folding portion direction can be suppressed. When the refractive index is set to 1.670 or more, bendability in the bending direction can be improved, and surface hardness can be improved. The refractive index is more preferably from 1.680 to 1.695. As a method of adjusting the refractive index in the direction orthogonal to the bending direction, there are given a stretching ratio, a stretching preheating temperature, a stretching temperature, multi-stage stretching, and film relaxation. The stretching ratio is preferably from 4.0 times to 6.0 times, more preferably from 4.4 times to 6.0 times. In addition, the stretching preheating temperature in the direction orthogonal to the bending direction is preferably from 70° C. to 110° C. When multi-stage stretching is performed in the direction orthogonal to the bending direction, it is preferred that a stretching ratio in a second or later stage be set to be higher than that in a first stage. The film may be relaxed by from 1% to 10% in each of the machine direction (longitudinal direction) and the perpendicular direction (width direction).

(With Regard to Refractive Index in Thickness Direction)

The refractive index in the thickness direction is preferably 1.520 or less. This is because, when the refractive index is set to 1.520 or less, even if the refractive index in the bending direction is designed to be low, a reduction in hardness of a film surface can be suppressed, and hence bendability and surface hardness can both be achieved. When the refractive index is set to 1.520 or less, the indentation depth after test force unloading in the thickness direction can be reduced to improve the hardness of the film surface, in particular, the pencil hardness of the hard coating film after the lamination of the hard coating layer. The refractive index is more preferably 1.515 or less, still more preferably 1.510 or less, particularly preferably 1.505 or less, most preferably 1.500 or less. The refractive index in the thickness direction is preferably low, but is preferably 1.3 or more from the viewpoint of stable production, and may be 1.4 or more. The refractive index is particularly preferably 1.410 or more. The above-mentioned range may be said to be achievable by increasing both of the stretching ratios in the bending direction and the folding direction, but in order to control the refractive index in the thickness direction while controlling the refractive indices in the bending direction and the width direction to preferred ranges, it is preferred to set conditions while checking a balance among the conditions of the steps of a film formation process.

As a method of controlling the refractive index in the thickness direction to the above-mentioned ranges, there is given a stretching preheating temperature, the stretching temperature, or the stretching ratio in the bending direction, the stretching preheating temperature or the stretching temperature in the folding portion direction, multi-stage stretching, high-ratio stretching, or a temperature setting for heat fixation. The stretching preheating temperature in the bending direction is preferably from 70° C. to 110° C. The stretching temperature in the bending direction is preferably from 75° C. to 120° C. The stretching ratio in the bending direction is preferably from 1.2 times to 2.0 times, more preferably from 1.7 times to 2.0 times. When stretching is performed at a low stretching temperature and a low stretching ratio, the refractive index in the thickness direction can be effectively decreased while the bendability in the bending direction is maintained. The stretching preheating temperature in the folding portion direction is also preferably from 75° C. to 110° C. The stretching temperature is preferably from 75° C. to 120° C. The stretching ratio in the folding portion is preferably from 4.0 times to 6.0 times, more preferably from 4.4 times to 6.0 times. While the refractive index in the bending direction is maintained or reduced, the refractive index in the thickness direction can be effectively reduced. Multi-stage stretching may be used as a method for high-ratio stretching. In that case, a stretching ratio in a second stage is preferably set to be higher than a stretching ratio in a first stage because the refractive index can be effectively controlled. In addition, a system involving performing stretching again after a crystallization step may be used. Accelerated stretching involving increasing stretching speed from an early stage of stretching to a late stage may be used.

The heat fixation temperature is preferably from 180° C. to 240° C. When heat fixation is performed, crystallization oriented in the stretching direction can proceed to decrease the refractive index in the thickness direction.

The reason why the hardness of the film surface is improved by decreasing the refractive index in the thickness direction is not necessarily clear, but it is conceivable that aromatics, such as benzene rings, in molecular chains are oriented in a plane direction to exhibit a suppressing effect on deformation due to stress applied in the thickness direction.

(With Regard to Density of Polyester Film)

The density of the polyester film, is preferably 1.380 g/cm³ or more. The density is more preferably 1.383 g/cm³ or more. When the density is set to 1.380 g/cm³ or more, the bendability can be improved, and the film surface hardness, in particular, the pencil hardness of the hard coating film after the lamination of the hard coating layer can be improved. The density is preferably as high as possible, and is preferably 1.40 g/cm³ or less, though somewhat depending on, for example, the presence or absence of particles in the film. When the heat fixation temperature at the time of film formation is set to from 180° C. to 240° C., crystallization can be caused to proceed to effectively increase the density.

The bending direction of the polyester film is preferably caused to correspond to its longitudinal direction (machine direction). With this configuration, the refractive index in the bending direction can be easily decreased in second-axial stretching, and hence the bendability can be easily improved. That is, a preferred polyester film is obtained by stretching the unstretched polyester sheet in its longitudinal direction at a stretching ratio of from 1.2 times to 2.0 times, more preferably from 1.7 times to 2.0 times. In addition, it may be said that a preferred mode involves performing stretching in the width direction at a stretching ratio of from 4.0 times to 6.0 times, more preferably from 4.4 times to 6.0 times.

In addition, in the present invention, it may be said that, in a particularly preferred mode, the polyester film is caused to simultaneously have the following four characteristics:

(1) the refractive index in the bending direction is from 1.590 to 1.620;

(2) the refractive index in the folding portion direction is from 1.670 to 1.700;

(3) the refractive index in the thickness direction is 1.520 or less; and (4) the density is 1.380 g/cm³ or more.

However, even in the case of a combination within the ranges of the above-mentioned preferred production conditions, when the combination is a combination of conditions that cannot be said to be the best within the respective preferred production condition ranges, such as a combination of a stretching ratio in the bending direction of 1.4 times or less, a stretching ratio in the folding portion direction of less than 4.4 times, and a heat fixation temperature of 220° C. or less, a polyester film that simultaneously satisfies the above-mentioned four characteristics may not be necessarily obtained in some cases. In this case, the above-mentioned four characteristics can be simultaneously satisfied through a fine adjustment of any one of the conditions, such as an increase in stretching ratio in the bending direction to 1.7 times or more, an increase in stretching ratio in the folding portion direction to 4.4 times or more, an increase in heat fixation temperature to about 230° C., or a decrease in stretching temperature in the bending direction and/or the folding portion direction, or a combination thereof.

In order to adjust film formability, film strength, thermal dimensional stability, appearance failure, and the like, any film formation system involving, for example, stretching, relaxation, heat fixation, and surface treatment may be adopted, but it may be said that the control of the refractive indices and density of the film to the above-mentioned preferred ranges is a particularly preferred mode in the present invention. When the refractive indices and the density are controlled to the preferred ranges, there can be provided a polyester film suitable for a foldable display, which can obtain bending resistance and surface hardness superior to those of the related-art film, in particular, a high pencil hardness of the hard coating film after the lamination of the hard coating layer.

Specifically, for example, after the pellets of PET are sufficiently dried in vacuum, the pellets are fed into an extruder, and melt-extruded in a sheet shape at about 280° C., followed by cooling and solidifying the sheet to form an unstretched PET sheet. The obtained unstretched sheet is stretched at a ratio of from 1.2 times to 2.0 times, more preferably from 1.7 times to 2.0 times in the longitudinal direction with rolls heated to from 75° C. to 120° C. to obtain a uniaxially oriented PET film. Further, the film is held with clips at the end portions thereof, guided to a hot air zone heated to from 75° C. to 120° C., dried, and then stretched at a ratio of from 4.0 times to 6.0 times, more preferably from 4.4 times to 6.0 times in the width direction. Subsequently, the film may be guided to a heat treatment zone at from 180° C. to 240° C., and treated with heat for 1 second to 60 seconds. During this heat treatment step, the film may be subjected to relaxation treatment by from 0% to 10% in the width direction or the longitudinal direction as required.

The limiting viscosity of the polyester film preferably falls within the range of from 0.50 dl/g to 1.0 dl/g. A case in which the limiting viscosity is 0.50 dl/g or more is preferred because impact resistance is improved, and hence breakage of a circuit in the display due to an external impact hardly occurs. Meanwhile, a case in which the limiting viscosity is 1.00 dl/g or less is preferred because film production is stabilized without an excessively large increase in filtration pressure of molten fluid.

(Easy-to-Adhere Layer)

In the present invention, in order to improve an adhesive property between the polyester film and the hard coating layer or the like, it is also preferred to laminate an easy-to-adhere layer on the polyester film. The easy-to-adhere layer may be obtained by applying an application liquid for forming the easy-to-adhere layer to one surface or both surfaces of an unstretched or longitudinally uniaxially stretched film, then drying the application liquid through heat treatment as required, and stretching the film in at least one unstretched direction. Heat treatment may also be performed after biaxial stretching. The final application amount of the easy-to-adhere layer is preferably controlled to from 0.005 g/m² to 0.20 g/m². A case in which the application amount is 0.005 g/m² or more is preferred because an adhesive property is obtained. Meanwhile, a case in which the application amount is 0.20 g/m² or less is preferred because blocking resistance is obtained.

As a resin that is incorporated into the application liquid to be used in the lamination of the easy-to-adhere layer, resins such as a polyester-based resin, a polyether polyurethane-based resin, a polyester polyurethane resin, a polycarbonate polyurethane resin, and an acrylic resin may be used without any particular limitation. Examples of a crosslinking agent that is incorporated into the application liquid for forming the easy-to-adhere layer include a melamine compound, an isocyanate compound, an oxazoline compound, an epoxy compound, and a carbodiimide compound. A mixture of two or more kinds may be used as each of the resin and the crosslinking agent. Those materials are preferably applied as an aqueous application liquid because of the properties of in-line coating, and the resin and the crosslinking agent are preferably a water-soluble or water-dispersible resin and compound.

Particles are preferably added to the easy-to-adhere layer in order to impart an easy slipping property. The average particle diameter of the fine particles is preferably 2 µm or less. When the average particle diameter of the particles is more than 2 µm, the particles are liable to fall out of the easy-to-adhere layer. Examples of the particles that are incorporated into the easy-to-adhere layer include: inorganic particles, such as titanium dioxide, barium sulfate, calcium carbonate, calcium sulfate, silica, alumina, talc, kaolin, clay, calcium phosphate, mica, hectorite, zirconia, tungsten oxide, lithium fluoride, and calcium fluoride; and organic polymer-based particles, such as styrene-based particles, acrylic particles, melamine-based particles, benzoguanamine-based particles, and silicone-base particles. Those particles may be added alone or combination thereof to the easy-to-adhere layer.

In addition, a known method may be used as a method of applying the application liquid as in the case of the application layer described above. Examples thereof include a reverse roll coating method, a gravure coating method, a kiss coating method, a roll brush coating method, a spray coating method, an air knife coating method, a wire bar coating method, and a pipe doctor method. Those methods may be performed alone or in combination thereof.

(Hard Coating Layer)

The polyester film preferably has the hard coating layer on at least one surface thereof. The hard coating layer is preferably used in the display by being positioned on the display surface side of the polyester film. The hard coating layer may be arranged on each of both surfaces in order to suppress curling. As a resin for forming the hard coating layer, resins such as an acrylic resin, a siloxane-based resin, an inorganic hybrid-based resin, a urethane acrylate-based resin, a polyester acrylate-based resin, and an epoxy-based resin may be used without any particular limitation. In addition, a mixture of two or more materials may be used, and particles such as an inorganic filler and an organic filler may be added.

(Thickness of Hard Coating Layer)

The thickness of the hard coating layer is preferably from 1 µm to 50 µm. A case in which the thickness is 1 µm or more is preferred because sufficient curing occurs to increase pencil hardness. In addition, when the thickness is set to 50 µm or less, curling caused by hardening and contraction of the hard coating can be suppressed, and thus film handleability can be increased.

(Application Method)

As a method of applying the hard coating layer, for example, a Meyer bar, a gravure coater, a die coater, and a knife coater may be used without any particular limitation and may be appropriately selected in accordance with viscosity and thickness.

(Curing Condition)

As a method of curing the hard coating layer, for example, a curing method using energy beams, such as UV light or electron beams, or a curing method using heat may be used. In order to reduce damage to the film, a curing method using UV light or electron beams is preferred.

(Pencil Hardness)

The pencil hardness of the hard coating layer is preferably 3H or more, more preferably 4H or more. When the pencil hardness is 3H or more, the hard coating layer is prevented from being easily scratched, and the visibility is not decreased. The pencil hardness of the hard coating layer is generally preferably as high as possible. However, the pencil hardness may be 9H or less or 8H or less, and even a hard coating layer having a pencil hardness of 6H or less is usable in practice without problems.

(Characteristics of Hard Coating Layer)

The hard coating layer in the present invention may be used for the purpose of protecting the display by increasing the pencil hardness of the surface as described above, and preferably has a high transmittance. The transmittance of the hard coating film, is preferably 85% or more, more preferably 88% or more. When the transmittance is 87% or more, sufficient visibility is obtained. The total light transmittance of the hard coating film is generally preferably as high as possible, but is preferably 99% or less from the viewpoint of stable production, and may be 97% or less. In addition, the haze of the hard coating film is generally preferably low, and is preferably 3% or less. The haze of the hard coating film is more preferably 2% or less, most preferably 1% or less. When the haze is 3% or less, the visibility of an image can be improved. The haze is generally desirably as low as possible, but is preferably 0.1% or more from the viewpoint of stable production, and may be 0.3% or more.

The hard coating layer may further have any other function imparted thereto. For example, hard coating layers each having functionality imparted thereto, such as an antiglare layer, an antiglare antireflection layer, an antireflection layer, a low-reflection layer, an antiscratch layer, and an antistatic layer each having the above-mentioned certain pencil hardness, are also preferably applied in the present invention.

In the foldable display of the present invention, the polyester film as described above is preferably used as the surface protective film. In this case, the hard coating layer is preferably arranged on a viewing side.

(Polarizer)

The foldable display of the present invention includes a polarizer. It is preferred that, in a liquid crystal display, polarizers be arranged on both sides of a liquid crystal cell, and in an EL display or the like, a circularly polarizing element (laminate of the polarizer and a quarter-λ layer) for reducing reflected light from an internal structure be used.

It is a mode preferred from the viewpoint of handling during the production of the foldable display that the polarizer is used as a polarizing plate having a laminated configuration of the polarizer and a polarizer protective film for protecting the polarizer.

Herein, the polarizer and a retardation layer (the polarizer protective film and a polarizer protective coating, if present, are included) are sometimes regarded as a single unit and referred to as "polarizing element".

A product obtained by adsorbing a dichroic dye, such as iodine, onto an oriented film formed of a polyvinyl alcohol (PVA)-based resin may be used as the polarizer (sometimes referred to as "polarizing film") that may be used in the present invention.

A typical method of producing the polarizer is a production method including a step of dyeing a single-layer body of a PVA-based resin and a step of stretching the single-layer body (single-layer stretching method). There is also given a production method including a step of arranging a PVA-based resin layer on a resin substrate for stretching by application or the like, followed by stretching in the resultant laminate state, and a step of dyeing the laminate (substrate-laminated stretching method). This production method is more preferred because the PVA-based resin layer, even when thin, can be stretched without a problem such as fracture due to the stretching by virtue of being supported by the resin substrate for stretching.

The substrate-laminated stretching method is preferably a production method including a step of performing stretching in an aqueous solution of boric acid from the viewpoint of being capable of allowing high-ratio stretching and improving polarization performance, and is more preferably a production method including a step of performing in-air auxiliary stretching before the stretching in an aqueous solution of boric acid. Further, a production method involving stretching a PVA-based resin layer and a resin substrate for stretching in the state of a laminate, and then excessively dyeing the PVA-based resin layer, followed by decoloration is also preferred. For those technologies, reference may be made to WO 2010/100917 A1, JP 2012-073563 A, JP 2012-073563 A, and JP 2011-2816 A. The polarizer produced by any of those methods may be preferably used in the present invention.

The polarizer obtained by the substrate-laminated stretching method is preferably arranged by being transferred onto the polarizer protective film or a retardation film. In addition, when further thinning is to be achieved by avoiding the use of the polarizer protective film, it is also preferred that the polarizer be arranged by being transferred onto an image display cell, a touchscreen, or the surface protective film.

The thickness of the polarizer is preferably 12 µm or less, more preferably 9 µm or less, still more preferably from 1 µm to 8 µm, particularly preferably from 3 µm to 6 µm. A case in which the thickness falls within the above-mentioned ranges is a preferred mode because bending is not inhibited.

In addition, a polarizer using a liquid crystal compound (liquid crystal polarizer) may also be preferably used from the viewpoint of being a thin polarizer, and the viewpoint that the absorption axis direction of the polarizer can be arranged in any direction.

The polarizer using a liquid crystal compound may be obtained by applying a coating liquid containing a polymerizable liquid crystal compound and an organic dichroic dye that have been aligned or a liquid crystalline dichroic dye to a film, such as the polarizer protective film, followed by drying, alignment, and photocuring or thermal curing. As a method of aligning the liquid crystal polarizer, there are given a method involving subjecting the surface of the film, to which the coating liquid is to be applied, to rubbing treatment, and a method involving performing irradiation with polarized UV light after the application of the coating liquid, to thereby cause the liquid crystal compound to be cured while being aligned.

Preferred specific examples of the polymerizable liquid crystal compound include compounds described in JP 2002-308832 A, JP 2007-16207 A, JP 2015-163596 A, JP 2007-510946 A, JP 2013-114131 A, WO 2005/045485 A1, and Lub et al. Recl. Trav. Chim. Pays-Bas, 115, 321-328 (1996).

Preferred examples of the dichroic dye include dyes described in JP 2007-126628 A, JP 2010-168570 A, JP 2013-101328 A, and JP 2013-210624 A.

In addition, a method involving arranging an alignment control layer before arranging the liquid crystal polarizer is also preferred.

For example, the following methods are given for the alignment control layer:
  a method involving applying any of polyvinyl alcohol and a derivative thereof, polyimide and a derivative thereof, an acrylic resin, a polysiloxane derivative, and the like, and subjecting the surface of the resultant to rubbing treatment to form an alignment layer (rubbed alignment control layer); and
  a method involving applying an application liquid containing a polymer or monomer having a photoreactive group, such as a cinnamoyl group and a chalcone group, and a solvent to a substrate film, and aligning and curing the resultant through irradiation with polarized UV light to form an alignment layer (photoalignment control layer).

Specific examples of the photoalignment control layer include alignment control layers described in JP 2006-285197 A, JP 2007-76839 A, JP 2007-138138 A, JP 2007-94071 A, JP 2007-121721 A, JP 2007-140465 A, JP 2007-156439 A, JP 2007-133184 A, JP 2009-109831 A, JP 2002-229039 A, JP 2002-265541 A, JP 2002-317013 A, JP 2003-520878 A, JP 2004-529220 A, JP 2013-33248 A, JP 2015-7702 A, and JP 2015-129210 A.

The liquid crystal polarizer is preferably arranged by application to the polarizer protective film, the retardation film, or the like. In addition, the liquid crystal polarizer arranged on a releasable substrate in conformity with the above-mentioned method may be arranged by transfer. In addition, when further thinning is to be achieved by avoiding the use of the polarizer protective film, it is also preferred that the liquid crystal polarizer be arranged by being transferred onto the image display cell, the touchscreen, or the surface protective film.

The thickness of the liquid crystal polarizer is preferably from 0.1 µm to 7 µm, more preferably from 0.3 µm to 5 µm, particularly preferably from 0.5 µm to 3 µm.

(Retardation Layer)

The foldable display of the present invention preferably includes a retardation layer (sometimes referred to as "retardation film") between the polarizer and the image display cell. When the image display cell is a liquid crystal cell, the retardation layer has such an optical compensation function for light from an oblique direction that a shift in retardation of light from an oblique direction caused by the liquid crystal compound of the cell is corrected to reduce a color shift.

In addition, when the image display cell is an EL cell or the like, the retardation layer has a function as a quarter-λ layer of a circularly polarizing plate.

For the retardation layer, one (retardation film) obtained by stretching a polymer film and one (liquid crystal retardation layer) obtained by aligning and fixing a liquid crystal compound may be used as a single layer or a retardation layer formed of a combination of a plurality of layers.

Examples of the retardation layer produced by orienting a polymer film through stretching include a polycycloolefin (COP) film, a polycarbonate (PC) film, a polypropylene (PP) film, an acrylic resin (Ac) film, and a triacetylcellulose (TAC) film.

Any appropriate stretching method may be adopted as a method of stretching the polymer film depending on purposes. Examples of the stretching method appropriate for the present invention include longitudinal uniaxial stretching, lateral uniaxial stretching, longitudinal/lateral simultaneous biaxial stretching, and longitudinal/lateral sequential biaxial stretching. Any appropriate stretching machine, such as a roll stretching machine or a tenter stretching machine, may be used as means for the stretching. The stretching is preferably performed under a state in which the polymer film is heated to a temperature equal to or higher than the glass transition temperature of its resin and equal to or lower than the melting point thereof, preferably within the range of the glass transition temperature+10° C. to 80° C. Preheating is preferably performed so that the polymer film reaches a temperature at which the polymer film can be stretched before the start of the stretching. In addition, the temperature may be continuously changed in the stretching step. The step may be a single step, or may be divided into two or more steps. With regard to a stretching direction, it is appropriate that the film be stretched in its width direction (TD direction) or an oblique direction.

Oblique stretching is performed as follows: while being fed in its longitudinal direction, an unstretched resin film is continuously subjected to oblique stretching treatment involving stretching in a direction forming an angle within the above-mentioned specific range with respect to the width direction of the film. With this procedure, an elongate retardation film whose width direction and slow axis form an angle (orientation angle θ) within the above-mentioned specific range can be obtained.

It is also preferred that the retardation layer be a retardation layer formed of a liquid crystal compound (liquid crystal retardation layer).

Examples of the liquid crystal compound include a rod-like liquid crystal compound, a polymeric liquid crystal compound, and a liquid crystal compound having a reactive functional group.

The liquid crystal compound is preferably a polymerizable liquid crystal compound having a polymerizable group, such as a double bond, from the viewpoint that its alignment state can be fixed. In addition, a rod-like liquid crystal compound, a discotic liquid crystal compound, or the like may be used as the liquid crystal compound.

Examples of the rod-like liquid crystal compound include rod-like ii aid crystal compounds each having a polymerizable group described in JP 2002-030042 A, JP 2004-204190 A, JP 2005-263789 A, JP 2007-119415 A, JP 2007-186430 A, and JP 11-513360 A.

Specific examples of the rod-like liquid crystal compound include:

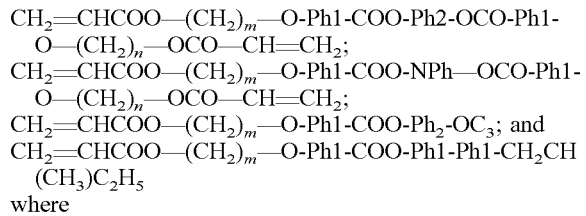

where
"m" and "n" each represent an integer of from 2 to 6,
Ph1 and Ph2 each represent a 1,4-phenylene group (Ph2 may be substituted with a methyl group at the 2-position), and
NPh represents a 2,6-naphthylene group.

Those rod-like liquid crystal compounds are commercially available as LC242 and the like from BASF, and those products may be utilized.

A plurality of kinds of those rod-like liquid crystal compounds may be used in combination at any ratio.

Examples of the discotic liquid crystal compound include a benzene derivative, a truxene derivative, a cyclohexane derivative, and an azacrown-based or phenyl acetylene-based macrocycle. Various examples of the discotic, liquid crystal compound are also described in JP 2001-155866 A, and these compounds are suitably used.

A method of arranging the liquid crystal retardation layer may be a method involving applying a composition (coating material) for a retardation layer onto the polarizer, or may be a method involving transferring a retardation layer on a releasable substrate (laminate for retardation layer transfer) onto the polarizer. In addition, the liquid crystal retardation layer may be applied or transferred onto a film (substrate film), such as a COP film, a PC film, a PP film, an Ac film, or a TAC film.

In addition, the substrate-laminated stretching method may be used to arrange the retardation layer on the polarizer on a substrate, or to arrange the retardation layer on the liquid crystal polarizer on a releasable substrate, followed by transfer thereof onto the substrate film.

The composition for a retardation layer may contain a solvent, a polymerization initiator, a sensitizer, a polymerization inhibitor, a leveling agent, and a polymerizable non-liquid crystal compound, a crosslinking agent, and the like.

A method similar to the method of aligning the liquid crystal polarizer described above may be adopted as a method of aligning the liquid crystal compound of the retardation layer. That is, examples thereof include a method involving applying a composition for a retardation layer, followed by irradiation with polarized UV light, a method involving subjecting the polarizer, the releasable substrate, the substrate film, or the like to rubbing treatment, and a method involving arranging an alignment control layer.

A plurality of retardation layers may be arranged. In this case, a laminate including a plurality of retardation layers on one releasable substrate may be used to transfer the plurality of retardation layers. In addition, a plurality of laminates each including one retardation layer on one releasable substrate may be used to transfer the retardation layers one by one. An application method and a transfer method may be combined.

In addition, the liquid crystal retardation layer may be applied or transferred onto a retardation film, such as a COP film, a PC film, a PP film, an Ac film, or a TAC film.

(Quarter-λ Layer for Circularly Polarizing Element)

A retardation layer in a circularly polarizing plate is preferably a quarter-λ layer. The quarter-λ layer is described in detail below.

(Quarter-λ Layer)

The quarter-λ layer is capable of converting linearly polarized light that has passed through a polarizer into circularly polarized light, and converting circularly polarized light reflected by wiring in an EL cell, a glass substrate touchscreen, or the like into linearly polarized light shifted by 90° from incident linearly polarized light. The quarter-λ layer may be a single-layer quarter-λ layer, or may be a composite quarter-λ layer of a quarter-λ layer and a half-λ layer. The quarter-λ layer may be provided with a C-plate layer or the like. The term "quarter-λ layer" as used herein collectively refers to layers each capable of imparting a retardation of quarter-λ, including not only the single-layer quarter-λ layer, but also retardation layers such as the composite quarter-λ layer and the C-plate layer.

The in-plane retardation of the quarter-λ layer is preferably from 100 nm to 180 nm, more preferably from 120 nm to 150 nm. The in-plane retardation of the half-λ layer is preferably from 200 nm to 360 nm, more preferably from 240 nm to 300 nm.

(Angle of Slow Axis of Quarter-λ Layer)

In the case of using the single-layer quarter-λ layer, an angle formed between the alignment axis (slow axis) of the quarter-λ layer and the transmission axis of the polarizer is preferably from 35° to 55°, more preferably from 40° to 50°, still more preferably from 42° to 48°.

In the case of the composite quarter-λ layer obtained by combining a quarter-λ layer and a half-λ layer, it is preferred that the alignment axis (slow axis) of each retardation layer be arranged at such an angle that the two layers give a retardation of quarter-λ. Specifically, an angle (θ) formed between the alignment axis (slow axis) of the half-λ layer and the transmission axis of the polarizer is preferably from 5° to 20°, more preferably from 7° to 17°. An angle formed between the alignment axis (slow axis) of the half-λ layer and the alignment axis (slow axis) of the quarter-λ layer falls within preferably the range of 2θ+45°±10°, more preferably the range of 2θ+45°±5°, still more preferably the range of 2θ+45°±3°.

For examples of the quarter-λ layer, reference may be made to, for example, JP 2008-149577 A, JP 2002-303722 A, WO 2006/100830 A1, JP 2015-64418 A, and JP 2018-10086 A.

Further, in order to reduce, for example, a change in coloration in the case of viewing from an oblique direction, it is also a preferred mode that a C-plate layer is arranged on the quarter-λ layer.

The retardation layers to be used in the present invention each singly have a thickness of preferably 20 µm or less, more preferably 10 µm or less, still more preferably from 1 µm to 9 µm, particularly preferably from 3 µm to 8 µm. In addition, in the case of a liquid crystal retardation layer, the thickness of the retardation layer is preferably from 1 µm to 5 µm, more preferably from 1.5 µm to 4 µm. A case in which the thickness falls within the above-mentioned ranges is a preferred mode because bending is not inhibited.

(Polarizer Protective Film)

In the foldable display of the present invention, it is also preferred that the polarizer protective film be used by being laminated on the polarizer. As the polarizer protective film, there may be used, for example, a film such as a COP film, a PC film, a PP film, an Ac film, a TAC film, or a polyester film. Of those, a TAC film or a polyester film is preferred from the viewpoint of folding durability.

The polarizer protective film has a thickness of preferably from 5 µm to 60 µm, more preferably from 10 µm to 40 µm, still more preferably from 10 µm to 30 µm, and may be appropriately provided with a surface treatment layer, such as an antiglare layer or an antireflection layer. A case in which the thickness falls within the above-mentioned ranges is a preferred mode because bending is not inhibited.

The polarizer protective film may be arranged on each of both sides, or only one side, of the polarizer. When the polarizer protective film is arranged only on one side of the polarizer, it is preferred that the retardation layer be arranged on the opposite surface. In this case, the retardation layer of a polymer film may be used and caused to have the function of a polarizer protective layer.

Preferred specific configurations include the following configurations.

(1a) Polarizer protective film/polarizer/retardation film
(1b) Polarizer protective film/polarizer/liquid crystal retardation layer/retardation film
(1c) Polarizer protective film/polarizer/liquid crystal retardation layer/substrate film (of retardation layer)

(Polarizer Protective Coating)

It is also preferred that a protective coating (polarizer protective coating) be applied to the polarizer in place of the polarizer protective film.

Suitable examples of the polarizer protective coating include materials to be used as coating agents for films, such as polyester, polyamide, polyurethane, acryl, and an amino resin. Further thinning can be achieved by adopting the polarizer protective coating in place of the polarizer protective film. The polarizer protective coating may be not only directly applied, but also arranged by transfer. When the polarizer or the retardation layer is obtained by transferring a liquid crystal compound, the protective coating layer and the polarizer or the retardation layer may be arranged on a releasable substrate and transferred as a single unit.

The thickness of the polarizer protective coating is preferably from 1 µm to 30 µm, more preferably from 3 µm to 20 µm, still more preferably from 5 µm to 10 µm.

The polarizer may have the protective coatings on both surfaces thereof, the polarizer may have the polarizer protective film on one surface thereof and the polarizer protective coating on the other surface thereof, or the polarizer may have the polarizer protective coatings on both surfaces thereof. Preferred specific configurations include the following configurations.

(2a) Polarizer protective film/polarizer/polarizer protective coating/retardation film
(2b) Polarizer protective film/polarizer/polarizer protective coating/liquid crystal retardation layer/retardation film
(2c) Polarizer protective film/polarizer/polarizer protective coating/liquid crystal retardation layer/substrate film (of retardation layer)
(3a) Polarizer protective coating/polarizer/retardation film
(3b) Polarizer protective coating/polarizer/liquid crystal retardation layer/retardation film
(3c) Polarizer protective coating/polarizer/liquid crystal retardation layer/substrate film (of retardation layer)
(4a) Polarizer protective coating/polarizer/polarizer protective coating/retardation film
(4b) Polarizer protective coating/polarizer/polarizer protective coating/liquid crystal retardation layer/retardation film
(4c) Polarizer protective coating/polarizer/polarizer protective coating/liquid crystal retardation layer/substrate film (of retardation layer)

Further, in "c" of the above-mentioned specific laminated configuration examples 1 to 4, a protective coating (retardation layer protective coating) may be arranged on the retardation layer in place of the substrate film (of the retardation layer). A material and an arrangement method for the retardation layer protective coating are similar to those for the polarizer protective coating.

In the above-mentioned specific configuration examples, a tackifier layer or an adhesive layer is present between the layers except in the case of directly applying the liquid crystal polarizer or the liquid crystal retardation layer, but is omitted here.

(Lamination of Polarizing Element)

In the foldable display of the present invention, the above-mentioned polarizing element is preferably laminated with another member (e.g., the image display cell, the touchscreen, or the surface protective film) via an adhesive layer. In this case, bonding may be performed by directly arranging an adhesive on the polarizer or the liquid crystal retardation layer without arranging the polarizer protective coating or the retardation layer protection coating on the other member surface of the polarizer.

(Adhesive layer)

A material for the adhesive layer is not particularly limited, and examples thereof include a rubber-based adhesive, an acrylic adhesive, a silicone-based adhesive, a urethane-based adhesive, a vinyl alkyl ether-based adhesive, a polyvinyl alcohol-based adhesive, a polyvinylpyrrolidone-based adhesive, a polyacrylamide-based adhesive, and a cellulose-based adhesive.

Of those, an acrylic adhesive is preferred from the viewpoints of transparency, weather resistance, heat resistance, and the like.

For example, the following methods are given for the adhesive layer: a method of forming the adhesive layer on the polarizing element by application; and a method involving using a commercially available optical adhesive sheet.

EXAMPLES

Next, the present invention is described by way of Examples and Comparative Examples. First, methods of evaluating characteristic values of a surface protective film performed in the present invention are shown below.

(1) Limiting Viscosity

A film or a polyester resin was pulverized and dried, and then dissolved in a mixed solvent of phenol/tetrachloroethane=60/40 (mass ratio). After this solution was centrifuged to remove inorganic particles, the flow time of the solution having a concentration of 0.4 (g/dl) at 30° C. and the flow time of the solvent alone were measured with an Ubbelohde viscometer. From a time ratio therebetween, the limiting viscosity was calculated using the Huggins equation on the assumption that the constant of the Huggins equation was 0.38.

(2) Bending Resistance of Polyester Film Sample (Bend Radius: 1.5 mm)

A polyester film sample having a size of 20 mm in its width direction and 110 mm in its machine direction was prepared. The sample was bent 200,000 times at a rate of once per second using a tension-free U-shape folding test jig (DLDMLH-FS manufactured by Yuasa System Co., Ltd.) with the bend radius being set to 1.5 mm. In this case, the sample was fixed at positions 10 mm away from both end portions on its long side, and hence the part to be bent had a size of 20 mm×90 mm. Here, FIG. 1 is a schematic view for illustrating a bend radius at a time when a foldable display is folded, and in consideration of a case in which a polyester film is arranged on the inside surface of the folded mode, the bending test is performed as a model assuming that the portion denoted by reference numeral 11 in FIG. 1 is set to 1.5 mm. After the completion of the bending treatment, the sample was placed on a flat surface with its bending inside facing down, and was visually observed.

○: No crack and deformation can be recognized on the sample.

×: The sample has a crack or a fold mark, and has a maximum floating height of 5 mm or more when horizontally placed.

(3) Bending Resistance of Polyester Film Sample (Bend Radius: 0.5 mm)

A polyester film sample was bent 200,000 times at a rate of once per second by the same method as in the above-mentioned bending test with the bend radius being set to 0.5 mm. Here, FIG. 1 is a schematic view for illustrating a bend radius at a time when a foldable display is folded, and in consideration of a case in which a polyester film is arranged on the inside surface of the folded mode, the bending test is performed as a model assuming that the portion denoted by reference numeral 11 in FIG. 1 is set to 0.5 mm. The film surface on the outside of the bent portion was observed with a digital microscope (RH8800 manufactured by Hirox Co., Ltd.) at a magnification of 700, and the presence or absence of a wrinkle (crack) was observed. Separate from the above-mentioned bending resistance visual observation test at a bend radius of 1.5 mm, this test, in which the bend radius was reduced to 0.5 mm, was performed with the intention of performing evaluation under a state closer to the state of actual use of a foldable display having a hard coating layer and other members laminated or bonded thereto. Separate from the above-mentioned visual observation at a bend radius of 1.5 mm, this test is intended to detect a defect of being liable to be fractured or being liable to be cracked, which is a minute defect difficult to detect by visual observation.

○: No defect is found on the film surface on the outside of the bending.

×: Fracture occurred, or a wrinkle (crack) can be recognized on the film surface on the outside of the bending.

(4) Bending Resistance of Hard Coating Film Sample (Bend Radius: 3.0 mm)

A hard coating film was bent 200,000 times at a rate of once per second by the same method as in the above-mentioned bending test with the bend radius being set to 3.0 mm. When a hard coating layer was present only on one side, a test in which the hard coating layer was positioned on the inside, and a test in which the hard coating layer was positioned on the outside were each performed.

○: The hard coating layer is free of breakage, and it cannot be recognized that the hard coating film is deformed.

×: It can be recognized that the hard coating layer is fractured or broken, or it can be recognized that the hard coating film is deformed.

(5) Refractive Index

A refractive index in a longitudinal direction, a refractive index in a width direction, and a refractive index in a thickness direction were determined using an Abbe refractometer (NAR-4T manufactured by Atago Co., Ltd., measurement wavelength: 589 nm) in conformity with JIS K 7142:2008 "Determination of the refractive index of plastics (Method A)."

(6) Pencil Hardness

The pencil hardness of a hard coating film was measured as a sample at a rate of 1.0 mm/s under a load of 750 g in conformity with JIS K 5600-5-4:1999. In the present invention, 3H or more was regarded as acceptable.

(7) Total Light Transmittance and Haze

Measurement was performed using a haze meter (NDH 5000 manufactured by Nippon Denshoku Industries Co., Ltd.)

(8) Density

A density was measured in accordance with a method in conformity with JIS K 7112:1999 (density gradient tube method). (Unit: g/cm$^3$).

(9) Indentation Depth after Test Force Unloading

A sample was cut into a square about 2 cm on a side, and its surface opposite to a measurement surface was fixed onto a micro cover glass measuring 18 mm×18 mm (manufactured by Matsunami Glass Ind., Ltd.) with a tackifier (Cemedine (trademark) High-super 30). After the fixation by bonding, the whole was left to stand at room temperature for 12 hours or more, and then an indentation depth (μm) after test force unloading was measured using a dynamic ultramicrohardness meter "DUH-211" (manufactured by Shimadzu Corporation) under the following conditions.

<<Measurement Conditions>>

Test mode: loading-unloading test
Indenter used: triangular pyramid indenter having an angle between ridges of 115°
Elastic modulus of indenter: $1.140 \times 10^6$ N/mm$^2$
Poisson's ratio of indenter: 0.07
Test force: 50 mN
Loading speed: 4.44 mN/sec
Loading retention time: 2 sec
Unloading retention time: 0 sec

(10) Maximum Heat Shrinkage Ratio

A sample film was cut to measure 10 mm long by 250 mm wide. The long sides were aligned to a direction in which measurement was to be performed, the sample film was marked at an interval of 200 mm, and an interval A between the marks was measured under a constant tension of 5 g. Subsequently, the sample film was left to stand under no load in an oven having an atmosphere of 150° C. for 30 minutes, and was then removed from the oven and cooled to room temperature. After that, an interval B between the marks was determined under a constant tension of 5 g, and a heat shrinkage ratio (%) was determined by the following equation. For the heat shrinkage ratio, measurement is performed at positions equally dividing the sample film in its width direction into three parts, and the average value of three points is adopted as the heat shrinkage ratio (%).

$$\text{Heat shrinkage ratio (\%)} = [(A-B) \times 100]/A$$

The sample film is separately cut so as to be different in length and width for each of both its bending direction and folding direction and subjected to measurement, and data in the direction in which the measured value is larger is adopted as a maximum heat shrinkage ratio (%).

(11) Tensile Moduli (Young's Moduli (Unit: GPa))

The tensile moduli of a polyester film in its bending direction and folding direction were measured at 23° C. in conformity with JIS K7127.

(Preparation of Polyethylene Terephthalate Pellets (a))

A continuous esterification reactor including a three-stage complete mixing vessel including a stirrer, a condenser, a raw material feeder, and a product extracting port was used as an esterification reactor. A slurry of TPA (2 tons/hr), EG (2 mol per mol of TPA), and antimony trioxide (160 ppm of Sb atoms based on produced PET) was continuously supplied to the first esterification reaction unit of the esterification reactor, and was allowed to react at 255° C. for an average residence time of 4 hours under normal pressure. Subsequently, the reaction product in the first esterification reaction unit was taken out of the system, and supplied to the second esterification reaction unit. EG evaporated from the first esterification reaction unit (8 mass % of the produced polymer (produced PET)) was supplied to the second esterification reaction unit. Further, an EG solution containing magnesium acetate such that the amount of Mg atoms was 65 ppm based on the produced PET and an EG solution containing TMPA such that the amount of P atoms was 20 ppm based on the produced PET were added thereto, and the mixture was reacted at 260° C. for an average residence time of 1.5 hours under normal pressure. Subsequently, the reaction product in the second esterification reaction unit was continuously taken out of the system and supplied to the third esterification reaction unit. An EG solution containing TMPA such that the amount of P atoms was 20 ppm based on the produced PET was further added thereto, followed by a reaction at 260° C. for an average residence time of 0.5 hour under normal pressure. The esterification reaction product generated in the third esterification reaction unit was continuously supplied to a three-stage continuous polycondensation reactor to perform polycondensation, followed by filtration through a filtering medium of a stainless-steel sintered body (nominal filtration accuracy: 5-μm particle 90% cut). Thus, polyethylene terephthalate pellets (a) having a limiting viscosity of 0.62 dl/g were obtained.

(Preparation of Polyethylene Terephthalate Pellets (b))

Polyethylene terephthalate pellets (b) were obtained by adjusting the limiting viscosity to 0.580 dl/g by the same method as in the production process of the polyethylene terephthalate pellets (a) except that the residence time for the third esterification reaction was adjusted.

(Preparation of Polyethylene Terephthalate Pellets (c))

The polyethylene terephthalate pellets (a) were subjected to solid-phase polymerization at 220° C. under a reduced pressure of 0.5 mmHg with a rotary vacuum polymerization apparatus while changing the reaction time. Thus, polyethylene terephthalate pellets (c) having a limiting viscosity of 0.75 dl/g were prepared.

(Polymerization of Urethane Resin)

A four-necked flask with a stirrer, a Dimroth condenser, a nitrogen inlet tube, a silica gel drying tube, and a temperature gauge was loaded with 72.96 parts by mass of 1,3-bis(isocyanatomethyl)cyclohexane, 12.60 parts by mass of dimethylol propionic acid, 11.74 parts by mass of neopentyl glycol, 112.70 parts by mass of a polycarbonate diol having a number-average molecular weight of 2,000, and 85.00 parts by mass of acetonitrile and 5.00 parts by mass of N-methylpyrrolidone serving as solvents. Under a nitrogen atmosphere, the mixture was stirred at 75° C. for 3 hours, and it was recognized that the reaction liquid had reached a predetermined amine equivalent. Next, the temperature of the reaction liquid was decreased to 40° C., and then 9.03 parts by mass of triethylamine was added to provide a polyurethane prepolymer D solution. Next, 450 g of water was added to a reaction vessel with a homodisper capable of high-speed stirring. The temperature was adjusted to 25° C., and water dispersion was performed by adding the isocyanate group-terminated prepolymer while the contents were mixed by stirring at 2,000 min−1. After that, some of the acetonitrile and the water were removed under reduced pressure to prepare a water-soluble polyurethane resin (A) having a solid content of 35 mass %.

(Polymerization of Water-Soluble Carbodiimide Compound)

A flask with a temperature gauge, a nitrogen gas inlet tube, a reflux condenser, a dropping funnel, and a stirrer was loaded with 200 parts by mass of isophorone diisocyanate and 4 parts by mass of 3-methyl-1-phenyl-2-phosphorene-1-oxide serving as a carbodiimidation catalyst, and the mixture was stirred under a nitrogen atmosphere at 180° C. for 10 hours to provide an isocyanate-terminated isophorone carbodiimide (degree of polymerization=5). Then, 111.2 g of the resultant carbodiimide and 80 g of polyethylene glycol monomethyl ether (molecular weight: 400) were subjected to a reaction at 100° C. for 24 hours. Water was gradually added thereto at 50° C. to provide a yellow transparent water-soluble carbodiimide compound (B) having a solid content of 40 mass %.

(Preparation of Application Liquid for Forming Easy-to-Adhere Layer)

The following coating agents were mixed to prepare an application liquid.

| | |
|---|---|
| Water | 16.97 parts by mass |
| Isopropanol | 21.96 parts by mass |
| Polyurethane resin (A) | 3.27 parts by mass |
| Water-soluble carbodiimide compound (B) | 1.22 parts by mass |
| Particles (silica sol having an average particle diameter of 40 nm, solid content concentration: 40 mass %) | 0.51 part by mass |
| Surfactant (silicone-based, solid content concentration: 100 mass %) | 0.05 part by mass |

(Preparation of Hard Coating Application Liquid "a")

To 100 parts by mass of a hard coating material (OPSTAR (trademark) Z7503 manufactured by JSR Corporation, concentration: 75%), 0.1 part by mass of a leveling agent (BYK307 manufactured by BYK-Chemie Japan, concentration: 100%) was added, and the mixture was diluted with methyl ethyl ketone to prepare a hard coating application liquid "a" having a solid content concentration of 40 mass %.

(Preparation of Hard Coating Application Liquid "b")

95 Parts by mass of pentaerythritol triacrylate (A-TMM-3 manufactured by Shin-Nakamura Chemical Co., Ltd., solid content concentration: 100%), 5 parts by mass of a photopolymerization initiator (IRGACURE (trademark) 907 manufactured by BASF Japan, solid content concentration: 100%), and 0.1 part by mass of a leveling agent (BYK307 manufactured by BYK-Chemie Japan, solid content concentration: 100%) were mixed, and the mixture was diluted with a solvent of toluene/MEK=1/1 to prepare a hard coating application liquid "b" having a concentration of 40 mass %.

(Polyester Film 1)

The polyethylene terephthalate pellets were fed to an extruder and melted at 285° C. The polymer was filtered through a filtering medium of a stainless-steel sintered body (nominal filtration accuracy: 10 μm-particle 95% cut) and extruded into a sheet shape from a mouthpiece, and then cooled and solidified through contact with a casting drum having a surface temperature of 30° C. using a static electricity applying casting method, to thereby produce an unstretched film. The unstretched film was uniformly heated to 75° C. using a heating roll, heated to 85° C. with a non-contact neater, and subjected to roll stretching (longitudinal stretching) at a ratio of 1.4 times. The above-mentioned application liquid for forming an easy-to-adhere layer was applied to both surfaces of the resultant uniaxially stretched film by a roll coating method, and was then dried at 80° C. for 20 seconds. An application amount after final (after biaxial stretching) drying was adjusted to 0.06 g/m². After that, the film was introduced into a tenter and preheated at 105° C., and then laterally stretched at 95° C. at a ratio of 4.0 times. The film was subjected to heat fixation at 230° C. for 5 seconds with its width fixed, and was relaxed by 4% in its width direction at 180° C. to provide a polyester film 1 having a thickness of 50 μm. The hard coating application liquid "a" was applied with a Meyer bar to one surface of the produced film so as to have a film thickness of 5 μm after drying, and was dried at 80° C. for 1 minute, followed by irradiation with UV light (cumulative light quantity: 200 mJ/cm²) to provide a hard coating film. Evaluation results are shown in Tables 1 and 2.

(Polyester Films 2 and 3)

Polyester films and hard coating films were obtained in the same manner as the polyester film 1 except that the stretching ratio in the longitudinal direction was changed as shown in in Table 1.

(Polyester Film 4)

A polyester film and a hard coating film were obtained in the same manner as the polyester film 1 except that the stretching ratio in the width direction was changed to 4.4 times, and the heat fixation temperature was changed to 220° C.

(Polyester Films 5 and 6)

Polyester films and hard coating films were obtained in the same manner as the polyester film 4 except that the stretching ratio in the longitudinal direction was changed as shown in Table 1.

(Polyester Film 7)

A polyester film and a hard coating film were obtained in the same manner as the polyester film 1 except that the stretching ratio in the width direction was changed to 5.5 times, and the heat fixation temperature was changed to 190° C.

(Polyester Films 8 and 9)

Polyester films and hard coating films were obtained in the same manner as the polyester film 7 except that the stretching ratio in the longitudinal direction was changed as shown in Table 1.

(Polyester Film 10)

A polyester film and a hard coating film were obtained in the same manner as the polyester film 5 except that, in the production process of the polyester film 5, 10% relaxation heat treatment was performed at 100° C. after the stretching in the longitudinal direction.

(Polyester Film 11)

A polyester film and a hard coating film were obtained in the same manner as in Example 5 except that, in the production process of the polyester film 5, clips were released at 200° C. after the heat fixation, and relaxation heat treatment was performed in the longitudinal direction and the width direction. A tenter speed and a take-up roll speed were adjusted so as to achieve a relaxation ratio of 3% in the longitudinal direction. The relaxation in the width direction was performed so as to achieve a free state.

(Polyester Film 12)

A polyester film and a hard coating film were obtained in the same manner as the polyester film 1 except that the temperature at the time of the stretching in the longitudinal direction was changed to 75° C., and the heat fixation temperature was changed to 220° C.

(Polyester Film 13)

A polyester film and a hard coating film were obtained in the same manner as the polyester film 1 except that the stretching in the longitudinal direction was performed with the temperature at the time of the stretching being changed to 75° C. and the stretching ratio being changed to 1.2 times, and then the stretching in the width direction was performed with the stretching ratio being changed to 5.0 times.

(Polyester Film 14)

A polyester film and a hard coating film were obtained in the same manner as the polyester film 3 except that the stretching in the longitudinal direction of the polyester film 3 was changed to two-stage stretching in which a stretching ratio in the first stage was set to 1.2 times and a stretching ratio in the second stage was set to 1.67 times. The total stretching ratio in the longitudinal direction is about 2.0 times.

(Polyester Film 15)

A polyester film and a hard coating film were obtained in the same manner as the polyester film 5 except that the preheating temperature at the time of the stretching in the width direction was changed to 95° C., and the heat fixation temperature was changed to 190° C.

(Polyester Film 16)

A polyester film and a hard coating film were obtained in the same manner as the polyester film 2 except that the stretching in the width direction of the polyester film 2 was changed to two-stage stretching in which a stretching ratio in the first stage was set to 1.5 times and a stretching ratio in the second stage was set to 4.0 times, and the heat fixation temperature was changed to 190° C. The total stretching ratio in the width direction is 6.0 times.

(Polyester Films 17 and 18)

Polyester films and hard coating films were obtained in the same manner as the polyester film 2 except that the thickness was changed as shown in Table 2.

(Polyester Film 19)

A polyester film and a hard coating film were obtained in the same manner as the polyester film 1 except that, in the production process of the polyester film 1, the relaxation heat treatment in the width direction was not performed.

(Polyester Film 20)

An unstretched film was produced in the same manner as the polyester film 1. After that, in a tenter, the unstretched film was preheated at 75° C. and laterally stretched at 85° C. at a ratio of 1.4 times. The above-mentioned application liquid for forming an easy-to-adhere layer was applied to both surfaces of the resultant uniaxially stretched film by a roll coating method, and was then dried at 80° C. for 20 seconds. An application amount after final (after biaxial stretching) drying was adjusted to 0.06 g/m². The film was uniformly heated to 105° C. using a heating roll, heated to 95° C. with a non-contact heater, and subjected to roll stretching (longitudinal stretching) at a ratio of 4.0 times. The film was subjected to heat fixation at 230° C. for 5 seconds with its width fixed to provide a polyester film and a hard coating film each having a thickness of 50 μm.

(Polyester Film 21)

A polyester film and a hard coating film were obtained in the same manner as the polyester film 1 except that lateral uniaxial stretching was performed by performing stretching only in the width direction without performing the stretching in the longitudinal direction.

(Polyester Film 22)

A polyester film and a hard coating film were obtained in the same manner as the polyester film 7 except that lateral uniaxial stretching was performed by performing stretching only in the width direction without performing the stretching in the longitudinal direction.

(Polyester Films 23 to 27)

Polyester films and hard coating films were obtained in the same manner as the polyester film 1 except that the heat fixation temperature was changed to 220° C., and PET pellets and thicknesses shown in Tables 1 and 2 were adopted.

In Comparative Examples 3 to 7, as described above, the heat fixation temperature is lower than in Example 1, and the stretching ratios in the longitudinal direction and the width direction are a combination of respective condition levels that cannot be said to be the best within preferred condition ranges. Consequently, as shown in Table 2, the refractive index in the thickness direction increased, the indentation depth after test force unloading increased, and the pencil hardness after the lamination of a hard coating layer reduced as compared to Examples.

(Polyester Film 28)

A polyester film and a hard coating film were obtained in the same manner as the polyester film 1 except that the stretching ratio in the longitudinal direction was changed to 2.7 times, and the heat fixation temperature was changed to 220° C.

(Polyester Film 29)

A polyester film and a hard coating film were obtained in the same manner as the polyester film 1 except that the stretching ratio in the longitudinal direction was changed to 3.4 times.

(Polyester Film 30)

A polyester film and a hard coating film were obtained in the same manner as the polyester film 4 except that the heat fixation temperature was changed to 100° C.

(Polyester Film 31)

A polyester film and a hard coating film were obtained in the same manner as the polyester film 13 except that the stretching temperature in the longitudinal direction was changed to 130° C.

(Polyester Film 32)

A polyester film and a hard coating film were obtained in the same manner as the polyester film 1 except that the preheating temperature in the width direction was changed to 120° C.

(Polyester Film 33)

A polyethylene terephthalate film having a thickness 50 μm was obtained in the same manner as the polyester film 1, and then a hard coating film was obtained by applying the hard coating application lie lid "b".

TABLE 1

| | | PET pellets | | | PET film (film formation conditions) | | | | | | |
|---|---|---|---|---|---|---|---|---|---|---|---|
| | | | | | | Stretching ratio | | Stretching temperature in longitudinal direction (° C.) | Preheating temperature in width direction (° C.) | Heat fixation temperature (° C.) | Relaxation direction | Relaxation ratio (%) |
| | | Kind | Limiting viscosity (dl/g) | Limiting viscosity (dl/g) | Longitudinal direction | Width direction | | | | | |
| Example 1 | Surface protective film 1 | (a) | 0.62 | 0.58 | 1.4 | 4.0 | 85 | 105 | 230 | Width direction | 4 |
| Example 2 | Surface protective film 2 | (a) | 0.62 | 0.58 | 1.7 | 4.0 | 85 | 105 | 230 | Width direction | 4 |

TABLE 1-continued

| | | PET pellets | | | | PET film (film formation conditions) | | | | |
|---|---|---|---|---|---|---|---|---|---|---|
| | | | Limiting viscosity (dl/g) | Limiting viscosity (dl/g) | Stretching ratio | Stretching temperature in longitudinal direction (° C.) | Preheating temperature in width direction (° C.) | Heat fixation temperature (° C.) | Relaxation direction | Relaxation ratio (%) |
| | Kind | | | | Longitudinal direction | Width direction | | | | |
| Example 3 | Surface protective film 3 | (a) | 0.62 | 0.58 | 2.0 | 4.0 | 85 | 105 | 230 | Width direction | 4 |
| Example 4 | Surface protective film 4 | (a) | 0.62 | 0.58 | 1.4 | 4.4 | 85 | 105 | 220 | Width direction | 4 |
| Example 5 | Surface protective film 5 | (a) | 0.62 | 0.58 | 1.7 | 4.4 | 85 | 105 | 220 | Width direction | 4 |
| Example 6 | Surface protective film 6 | (a) | 0.62 | 0.58 | 2.0 | 4.4 | 85 | 105 | 220 | Width direction | 4 |
| Example 7 | Surface protective film 7 | (a) | 0.62 | 0.58 | 1.4 | 5.5 | 85 | 105 | 190 | Width direction | 4 |
| Example 8 | Surface protective film 8 | (a) | 0.62 | 0.58 | 1.7 | 5.5 | 85 | 105 | 190 | Width direction | 4 |
| Example 9 | Surface protective film 9 | (a) | 0.62 | 0.58 | 2.0 | 5.5 | 85 | 105 | 190 | Width direction | 4 |
| Example 10 | Surface protective film 10 | (a) | 0.62 | 0.58 | 1.7 | 4.4 | 85 | 105 | 220 | Longitudinal direction | 10 |
| Example 11 | Surface protective film 11 | (a) | 0.62 | 0.58 | 1.7 | 4.4 | 85 | 105 | 220 | Longitudinal/width direction | 3/— |
| Example 12 | Surface protective film 12 | (a) | 0.62 | 0.58 | 1.4 | 4.0 | 75 | 105 | 220 | Width direction | 4 |
| Example 13 | Surface protective film 13 | (a) | 0.62 | 0.58 | 1.2 | 5.0 | 75 | 105 | 220 | Width direction | 4 |
| Example 14 | Surface protective film 14 | (a) | 0.62 | 0.58 | 2.0 (two stages) | 4.0 | 85 | 105 | 230 | Width direction | 4 |
| Example 15 | Surface protective film 15 | (a) | 0.62 | 0.58 | 1.7 | 4.4 | 85 | 95 | 190 | Width direction | 4 |
| Example 16 | Surface protective film 16 | (a) | 0.62 | 0.58 | 1.7 | 6.0 (two stages) | 85 | 105 | 190 | Width direction | 4 |
| Example 17 | Surface protective film 17 | (a) | 0.62 | 0.58 | 1.7 | 4.0 | 85 | 105 | 230 | Width direction | 4 |
| Example 18 | Surface protective film 18 | (a) | 0.62 | 0.58 | 1.7 | 4.0 | 85 | 105 | 230 | Width direction | 4 |
| Example 19 | Surface protective film 19 | (a) | 0.62 | 0.58 | 1.4 | 4.0 | 85 | 105 | 230 | — | 0 |
| Example 20 | Surface protective film 20 | (a) | 0.62 | 0.58 | 4.0 | 1.4 | 105 | 85 | 230 | — | 0 |
| Comparative Example 1 | Surface protective film 21 | (a) | 0.62 | 0.58 | 1.0 | 4.0 | — | 105 | 220 | Width direction | 4 |
| Comparative Example 2 | Surface protective film 22 | (a) | 0.62 | 0.58 | 1.0 | 5.5 | — | 105 | 190 | Width direction | 4 |
| Comparative Example 3 | Surface protective film 23 | (a) | 0.62 | 0.58 | 1.4 | 4.0 | 85 | 105 | 220 | Width direction | 4 |
| Comparative Example 4 | Surface protective film 24 | (a) | 0.62 | 0.58 | 1.4 | 4.0 | 85 | 105 | 220 | Width direction | 4 |
| Comparative Example 5 | Surface protective film 25 | (a) | 0.62 | 0.58 | 1.4 | 4.0 | 85 | 105 | 220 | Width direction | 4 |

TABLE 1-continued

| | | PET film (film formation conditions) | | | | | | | | |
|---|---|---|---|---|---|---|---|---|---|---|
| | | PET pellets | | | Stretching ratio | | Stretching temperature in longitudinal direction (° C.) | Preheating temperature in width direction (° C.) | Heat fixation temperature (° C.) | | Relaxation ratio (%) |
| | | Kind | Limiting viscosity (dl/g) | Limiting viscosity (dl/g) | Longitudinal direction | Width direction | | | | Relaxation direction | |
| Comparative Example 6 | Surface protective film 26 | (b) | 0.58 | 0.54 | 1.4 | 4.0 | 85 | 105 | 220 | Width direction | 4 |
| Comparative Example 7 | Surface protective film 27 | (c) | 0.75 | 0.69 | 1.4 | 4.0 | 85 | 105 | 220 | Width direction | 4 |
| Comparative Example 8 | Surface protective film 28 | (a) | 0.62 | 0.58 | 2.7 | 4.0 | 85 | 105 | 220 | Width direction | 4 |
| Comparative Example 9 | Surface protective film 29 | (a) | 0.62 | 0.58 | 3.4 | 4.0 | 85 | 105 | 230 | Width direction | 4 |
| Comparative Example 10 | Surface protective film 30 | (a) | 0.62 | 0.58 | 1.4 | 4.4 | 85 | 105 | 100 | Width direction | 4 |
| Comparative Example 11 | Surface protective film 31 | (a) | 0.62 | 0.58 | 1.2 | 5.0 | 130 | 105 | 220 | Width direction | 4 |
| Comparative Example 12 | Surface protective film 32 | (a) | 0.62 | 0.58 | 1.4 | 4.0 | 85 | 120 | 230 | Width direction | 4 |
| Example 21 | Surface protective film 33 | (a) | 0.62 | 0.58 | 1.4 | 4.0 | 85 | 105 | 230 | Width direction | 4 |

TABLE 2

| | | Thickness (μm) | Density (g/cm³) | Refractive index Longitudinal direction | Refractive index Width direction | Refractive index Thickness direction | Bending direction | Continuous bending test at bend radius of 1.5 mm | Continuous bending test at bend radius of 0.5 mm | Elastic modulus (GPa) Longitudinal direction | Elastic modulus (GPa) Width direction | Indentation depth after unloading (μm) | Maximum heat shrinkage ratio (%) | Hard coating application liquid | Total light transmittance (%) | Haze (%) | Pencil hardness | Continuous bending test at bend radius of 3 mm Hard coating layer on inside | Continuous bending test at bend radius of 3 mm Hard coating layer on outside |
|---|---|---|---|---|---|---|---|---|---|---|---|---|---|---|---|---|---|---|---|
| Example 1 | Surface protective film 1 | 50 | 1.385 | 1.596 | 1.684 | 1.516 | Longitudinal direction | ○ | ○ | 2.3 | 5.4 | 0.8 | 1.4 | a | 90.2 | 0.4 | 3H | ○ | ○ |
| Example 2 | Surface protective film 2 | 50 | 1.385 | 1.602 | 1.681 | 1.512 | Longitudinal direction | ○ | ○ | 2.4 | 4.8 | 0.8 | 1.5 | a | 90.3 | 0.3 | 3H | ○ | ○ |
| Example 3 | Surface protective film 3 | 50 | 1.387 | 1.609 | 1.679 | 1.509 | Longitudinal direction | ○ | ○ | 2.3 | 4.7 | 0.8 | 1.6 | a | 90.0 | 0.4 | 3H | ○ | ○ |
| Example 4 | Surface protective film 4 | 50 | 1.383 | 1.592 | 1.69 | 1.517 | Longitudinal direction | ○ | ○ | 2.2 | 5.7 | 0.8 | 1.7 | a | 90.2 | 0.3 | 3H | ○ | ○ |
| Example 5 | Surface protective film 5 | 50 | 1.383 | 1.597 | 1.688 | 1.515 | Longitudinal direction | ○ | ○ | 2.3 | 5.1 | 0.8 | 1.9 | a | 90.2 | 0.3 | 3H | ○ | ○ |
| Example 6 | Surface protective film 6 | 50 | 1.384 | 1.598 | 1.686 | 1.513 | Longitudinal direction | ○ | ○ | 2.4 | 5.0 | 0.8 | 2.2 | a | 90.2 | 0.2 | 3H | ○ | ○ |
| Example 7 | Surface protective film 7 | 50 | 1.383 | 1.591 | 1.694 | 1.513 | Longitudinal direction | ○ | ○ | 2.2 | 6.3 | 0.8 | 4.4 | a | 90.2 | 0.3 | 3H | ○ | ○ |
| Example 8 | Surface protective film 8 | 50 | 1.383 | 1.596 | 1.690 | 1.512 | Longitudinal direction | ○ | ○ | 2.3 | 5.9 | 0.8 | 4.9 | a | 90.2 | 0.3 | 3H | ○ | ○ |
| Example 9 | Surface protective film 9 | 50 | 1.383 | 1.597 | 1.688 | 1.513 | Longitudinal direction | ○ | ○ | 2.4 | 5.8 | 0.8 | 5.1 | a | 90.2 | 0.3 | 3H | ○ | ○ |
| Example 10 | Surface protective film 10 | 50 | 1.385 | 1.594 | 1.689 | 1.515 | Longitudinal direction | ○ | ○ | 2.1 | 5.1 | 0.8 | 1.0 | a | 90.2 | 0.3 | 3H | ○ | ○ |
| Example 11 | Surface protective film 11 | 50 | 1.385 | 1.596 | 1.687 | 1.515 | Longitudinal direction | ○ | ○ | 2.1 | 5.1 | 0.8 | 0.8 | a | 90.2 | 0.3 | 3H | ○ | ○ |
| Example 12 | Surface protective film 12 | 50 | 1.385 | 1.606 | 1.684 | 1.518 | Longitudinal direction | ○ | ○ | 2.4 | 5.4 | 0.8 | 1.5 | a | 90.2 | 0.3 | 3H | ○ | ○ |

TABLE 2-continued

| | | Thick-ness (μm) | Density (g/cm³) | Refractive index Longitudinal direction | Refractive index Width direction | Refractive index Thickness direction | Bending direction | Continuous bending test at bend radius of 1.5 mm | Continuous bending test at bend radius of 0.5 mm | Elastic modulus (GPa) Longitudinal direction | Elastic modulus (GPa) Width direction | Indentation depth after unloading (μm) | Maximum heat shrinkage ratio (%) | Hard coating application liquid | Total light transmittance (%) | Haze (%) | Pencil hardness | Continuous bending test at bend radius of 3 mm Hard coating layer on inside | Continuous bending test at bend radius of 3 mm Hard coating layer on outside |
|---|---|---|---|---|---|---|---|---|---|---|---|---|---|---|---|---|---|---|---|
| Example 13 | Surface protective film 13 | 50 | 1.386 | 1.591 | 1.685 | 1.519 | Longitudinal direction | ○ | ○ | 2.0 | 5.7 | 0.8 | 1.5 | a | 90.0 | 0.4 | 3H | ○ | ○ |
| Example 14 | Surface protective film 14 | 50 | 1.388 | 1.606 | 1.681 | 1.511 | Longitudinal direction | ○ | ○ | 2.4 | 4.7 | 0.8 | 1.6 | a | 90.0 | 0.4 | 3H | ○ | ○ |
| Example 15 | Surface protective film 15 | 50 | 1.383 | 1.598 | 1.691 | 1.495 | Longitudinal direction | ○ | ○ | 2.3 | 5.4 | 0.8 | 5.0 | a | 90.2 | 0.4 | 3H | ○ | ○ |
| Example 16 | Surface protective film 16 | 50 | 1.384 | 1.594 | 1.695 | 1.508 | Longitudinal direction | ○ | ○ | 2.3 | 6.8 | 0.8 | 4.7 | a | 90.2 | 0.3 | 3H | ○ | ○ |
| Example 17 | Surface protective film 17 | 25 | 1.387 | 1.602 | 1.681 | 1.512 | Longitudinal direction | ○ | ○ | 2.4 | 4.8 | 0.8 | 1.4 | a | 90.2 | 0.3 | 3H | ○ | ○ |
| Example 18 | Surface protective film 18 | 75 | 1.386 | 1.602 | 1.681 | 1.512 | Longitudinal direction | ○ | ○ | 2.4 | 4.8 | 0.8 | 1.5 | a | 90.2 | 0.3 | 3H | ○ | ○ |
| Example 19 | Surface protective film 19 | 50 | 1.384 | 1.598 | 1.687 | 1.513 | Longitudinal direction | ○ | ○ | 2.3 | 5.4 | 0.8 | 2.0 | a | 90.2 | 0.3 | 3H | ○ | ○ |
| Example 20 | Surface protective film 20 | 50 | 1.385 | 1.686 | 1.593 | 1.516 | Width direction | ○ | ○ | 5.1 | 2.4 | 0.8 | 1.5 | a | 90.2 | 0.3 | 3H | ○ | ○ |
| Comparative Example 1 | Surface protective film 21 | 50 | 1.380 | 1.588 | 1.694 | 1.522 | Longitudinal direction | ○ | × | 2.1 | 5.6 | 0.8 | 1.4 | a | 90.2 | 0.3 | 1H | ○ | ○ |
| Comparative Example 2 | Surface protective film 22 | 50 | 1.383 | 1.584 | 1.701 | 1.512 | Longitudinal direction | ○ | × | 2.0 | 7.5 | 0.8 | 3.7 | a | 90.2 | 0.4 | 2H | × | ○ |
| Comparative Example 3 | Surface protective film 23 | 50 | 1.381 | 1.601 | 1.684 | 1.524 | Longitudinal direction | ○ | ○ | 2.3 | 5.4 | 0.8 | 1.8 | a | 90.2 | 0.3 | 2H | × | ○ |
| Comparative Example 4 | Surface protective film 24 | 25 | 1.381 | 1.591 | 1.676 | 1.530 | Longitudinal direction | ○ | ○ | 2.3 | 5.4 | 0.8 | 1.8 | a | 90.2 | 0.3 | 2H | ○ | ○ |

TABLE 2-continued

| | | Thickness (μm) | Density (g/cm³) | Refractive index Longitudinal direction | Refractive index Width direction | Refractive index Thickness direction | Bending direction | PET film (evaluation results) Continuous bending test at bend radius of 1.5 mm | Continuous bending test at bend radius of 0.5 mm | Elastic modulus (GPa) Longitudinal direction | Elastic modulus (GPa) Width direction | Indentation depth after unloading (μm) | Maximum heat shrinkage ratio (%) | Hard coating application liquid | Hard coating film Total light transmittance (%) | Haze (%) | Pencil hardness | Continuous bending test at bend radius of 3 mm Hard coating layer on inside | Hard coating layer on outside |
|---|---|---|---|---|---|---|---|---|---|---|---|---|---|---|---|---|---|---|---|
| Comparative Example 5 | Surface protective film 25 | 75 | 1.381 | 1.623 | 1.690 | 1.526 | Longitudinal direction | x | ○ | 2.3 | 5.4 | 0.8 | 1.8 | a | 90.2 | 0.3 | 2H | x | ○ |
| Comparative Example 6 | Surface protective film 26 | 50 | 1.382 | 1.598 | 1.682 | 1.524 | Longitudinal direction | ○ | ○ | 2.1 | 5.1 | 0.8 | 1.8 | a | 90.2 | 0.2 | 2H | ○ | ○ |
| Comparative Example 7 | Surface protective film 27 | 50 | 1.380 | 1.603 | 1.688 | 1.522 | Longitudinal direction | ○ | ○ | 2.4 | 5.6 | 0.8 | 1.8 | a | 90.2 | 0.3 | 2H | ○ | ○ |
| Comparative Example 8 | Surface protective film 28 | 50 | 1.398 | 1.631 | 1.688 | 1.500 | Longitudinal direction | x | ○ | 3.2 | 3.9 | 0.8 | 1.5 | a | 90.2 | 0.3 | 3H | x | x |
| Comparative Example 9 | Surface protective film 29 | 50 | 1.396 | 1.650 | 1.669 | 1.496 | Longitudinal direction | x | ○ | 3.4 | 4.3 | 0.8 | 1.0 | a | 90.2 | 0.2 | 3H | x | x |
| Comparative Example 10 | Surface protective film 30 | 50 | 1.364 | 1.578 | 1.660 | 1.532 | Longitudinal direction | x | x | 2.4 | 6.3 | 0.8 | 6.3 | a | 90.2 | 0.3 | 2H | x | ○ |
| Comparative Example 11 | Surface protective film 31 | 50 | 1.385 | 1.589 | 1.685 | 1.522 | Longitudinal direction | ○ | ○ | 2.0 | 5.7 | 0.8 | 1.5 | a | 90.2 | 0.3 | 2H | x | ○ |
| Comparative Example 12 | Surface protective film 32 | 50 | 1.384 | 1.596 | 1.679 | 1.526 | Longitudinal direction | ○ | ○ | 2.5 | 4.0 | 0.8 | 1.4 | a | 90.2 | 0.3 | 2H | ○ | ○ |
| Example 21 | Surface protective film 33 | 50 | 1.385 | 1.596 | 1.684 | 1.516 | Longitudinal direction | ○ | ○ | 2.3 | 5.4 | 0.8 | 1.4 | b | 90.2 | 0.4 | 3H | ○ | ○ |

(Examples and Comparative Examples)
(Production and Evaluation of Foldable Display including Surface Protective Film, Polarizer, and Retardation Layer)

Foldable display models each including a polarizer and a retardation layer were produced using the above-mentioned polyester films as surface protective films.

(Production of Circularly Polarizing Plate A)

One surface of a triacetylcellulose (TAC) film having a thickness of 20 μm was subjected to saponification treatment, the polarizer surface of a laminate for PVA polarizer transfer was bonded to the saponification-treated surface using a UV-curable tackifier, and then the thermoplastic resin substrate of the laminate was peeled off.

The retardation layer surface of a quarter-λ plate was bonded to the peeling surface (polarizer surface) using a UV-curable tackifier to provide a circularly polarizing plate A.

The laminate for PVA polarizer transfer and the retardation plate were produced as described below.

(Production of Laminate for PVA Polarizer Transfer)

Polyethylene terephthalate having a limiting viscosity of 0.62 dl/g was melt-kneaded with an extruder, and then extruded into a sheet shape onto a chill roll to produce an unstretched film having a thickness of 100 μm as the thermoplastic resin substrate. An aqueous solution of polyvinyl alcohol having a degree of polymerization of 2,400 and a degree of saponification of 99.9 mol % was applied to one surface of the unstretched film and dried to form a PVA layer.

The resultant laminate was stretched in its longitudinal direction at a ratio of 2 times at 120° C. between rolls having different peripheral speeds and taken up. Next, the resultant laminate was treated in a 4% aqueous solution of boric acid for 30 seconds, and then dyed by being immersed in a mixed aqueous solution of iodine (0.2%) and potassium iodide (1%) for 60 seconds, followed by treatment in a mixed aqueous solution of potassium iodide (3%) and boric acid (3%) for 30 seconds.

Further, the laminate was uniaxially stretched in its longitudinal direction in a mixed aqueous solution of boric acid (4%) and potassium iodide (5%) at 72° C., and then washed with a 4% aqueous solution of potassium iodide, and the aqueous solution was removed with an air knife. After that, the laminate was dried in an oven at 80° C., slit at both end portions, and taken up to provide a laminate for PVA polarizer transfer having a width of 50 cm and a length of 1,000 m. The total stretching ratio was 6.5 times, and the thickness of the polarizer was 5 μm. The thickness was read by embedding the substrate-laminated polarizer in an epoxy resin, cutting out a section, and observing the section with an optical microscope.

(Production of Quarter-λ Plate)

One surface of a triacetylcellulose (TAC) film having a thickness of 20 μm was subjected to saponification treatment, and a coating material composition for an alignment control layer was applied to the saponification-treated surface and dried at 100° C. to form an alignment control layer having a thickness of 0.5 μm. Further, the alignment control layer was treated with a rubbing roll wrapped in raised cloth made of nylon. The rubbing was performed in a direction at 45° with respect to the machine direction of the film.

Subsequently, a composition coating material for a retardation layer was applied to the rubbing-treated surface, and then heated at 110° C. for 3 minutes to evaporate the solvent, and to align a liquid crystalline compound. Subsequently, the resultant was irradiated with UV light under an environment of 110° C. for 30 seconds to provide a laminate for PVA polarizer transfer including the TAC film and a quarter-λ layer.

(Application Liquid for Alignment Control Layer)

| | |
|---|---|
| Modified polyvinyl alcohol described below | 10 parts by mass |
| Water | 371 parts by mass |
| Methanol | 119 parts by mass |
| Glutaraldehyde | 0.5 part by mass |

Modified polyvinyl alcohol

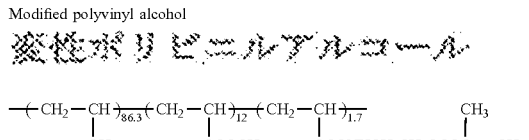

$$-(CH_2-CH)_{86.3}-(CH_2-CH)_{12}-(CH_2-CH)_{1.7}\quad CH_3$$
$$\quad\quad |\quad\quad\quad\quad |\quad\quad\quad\quad\quad |\quad\quad\quad\quad |$$
$$\quad\quad OH\quad\quad\quad OCOCH_3\quad\quad OCONHCH_2CH_2OCOC=CH_2$$

(Composition Coating Material for Retardation Layer)

| | |
|---|---|
| LC242 (manufactured by BASF) | 95 parts by mass |
| Trimethylolpropan triacrylate | 5 parts by mass |
| IRGACURE 379 | 3 parts by mass |
| Surfactant | 0.1 part by mass |
| Methyl ethyl ketone | 250 parts by mass |

(Production of Circularly Polarizing Plate B)

A polyvinyl alcohol film was stretched at a ratio of 3 times between rolls having different speed ratios while being dyed in an iodine solution having a concentration of 0.3% at 30° C. for 1 minute. After that, the film was stretched so that the total stretching ratio became 6 times while being immersed in an aqueous solution containing boric acid at a concentration of 4% and potassium iodide at a concentration of 10% at 60° C. for 0.5 minute. Then, the film was washed by being immersed in an aqueous solution containing potassium iodide at a concentration of 1.5% at 30° C. for 10 seconds, and was then dried at 50° C. for 4 minutes to provide a polarizer having a thickness of 10 μm. A saponification-treated triacetylcellulose (TAC) film having a thickness of 20 μm was bonded to one surface of the resultant polarizer, and the retardation layer surface of the above-mentioned quarter-λ plate was bonded to the other surface to provide a circularly polarizing plate B. A UV-curable tackifier was used for the bonding.

(Production of Circularly Polarizing Plate C)

One surface of a triacetylcellulose (TAC) film having a thickness of 20 μm was subjected to saponification treatment, and the above-mentioned coating material composition for an alignment control layer was applied to the saponification-treated surface and dried at 100° C. to form an alignment control layer having a thickness of 0.5 μm. Further, the alignment control layer was treated with a rubbing roll wrapped in raised cloth made of nylon. The rubbing was performed in a direction parallel to the machine direction of the film.

Subsequently, the following coating material for a liquid crystal polarizing film was applied to the rubbing-treated surface, and dried at 110° C. for 3 minutes to form a film having a thickness of 2 μm. Subsequently, the film was irradiated with UV light to provide a polarizing plate including a polarizer of a liquid crystal compound on the TAC film.

(Coating Material for Liquid Crystal Polarizing Film)
(Synthesis of Polymerizable Liquid Crystal Compound)

The following compounds (a) and (b) were synthesized with reference to the description in paragraph [0134] of JP 2007-510946 A, and Lub et al. Recl. Trav. Chim. Pays-Bas, 115, 321-328 (1996).

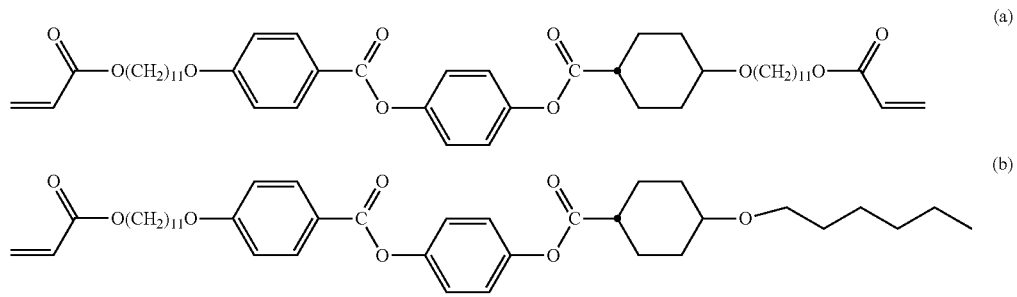

The following dye (c) was synthesized with reference to Example 1 of JP 63-301850 A.

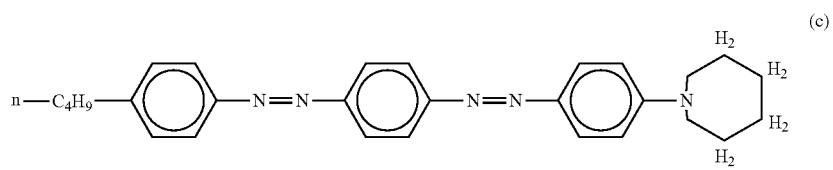

The following dye (d) was synthesized with reference to Example 2 of JP 05-49710 B2.

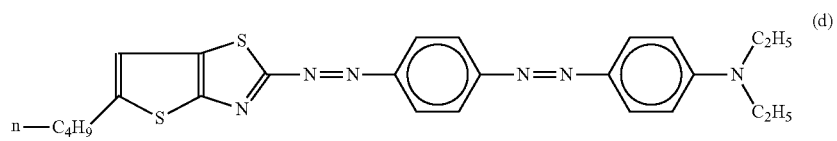

The following dye (e) was synthesized with reference to a method of producing a compound of the general formula (1) of JP 63-1357 B2.

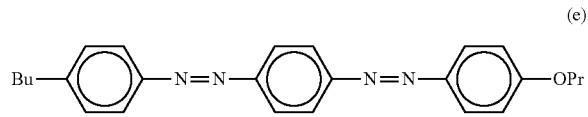

(Production of Coating Material)

75 Parts by mass of (a), 25 parts by mass of (b), 2.5 parts by mass of (c), 2.5 parts by mass of (d), 2.5 parts by mass of (e), 6 parts by mass of IRGACURE (trademark) 369E (manufactured by BASF), and 250 parts mass of o-xylene were mixed and dissolved.

The polarizer surface of the resultant polarizing plate and the retardation layer surface of the above-mentioned quarter-λ plate were bonded to each other using a UV-curable tackifier to provide a circularly polarizing plate C.

(Production of Circularly Polarizing Plate D)

The retardation layer surface of the above-mentioned quarter-λ plate and the polarizer surface of the above-mentioned laminate for PVA polarizer transfer were bonded to each other using a UV-curable tackifier. After that, the thermoplastic substrate of the laminate for PVA polarizer transfer was peeled off to provide a circularly polarizing plate D.

(Production of Circularly Polarizing Plate E)

The following protective coating composition was applied to the non-easy-to-adhere surface of a biaxially stretched polyester film (A4100 manufactured by Toyobo Co., Ltd.), and dried, followed by irradiation with UV light. Further, an alignment control layer and a quarter-λ layer were arranged on the protective coating surface in the same manner as in the production of the quarter-λ layer. Subsequently, an alignment control layer was arranged on the quarter-λ layer, and a polarizer formed of a liquid crystal compound was arranged on the alignment control layer in the same manner as in the production of the circularly polarizing plate C.

(Composition for Protective Coating Layer)

| | |
|---|---|
| Urethane acrylate AH-600 (manufactured by Kyoeisha Chemical Co., Ltd.) | 25 parts by mass |
| Polymerization initiator IRGACURE 184 (manufactured by Ciba Specialty Chemicals) | 1.25 parts by mass |
| Isopropyl alcohol | 75 parts by mass |

(Production of Laminate of Surface Protective Film and Circularly Polarizing Plate)

The surface protective film (hard coating film) and the polarizer side surface of the circularly polarizing plate were bonded to each other using a substrate-less adhesive sheet for optical use (thickness: 25 μm).

(Production of Foldable Display Model)

Further, a polyester film assuming a touchscreen (diversion of the surface protective film), two sheets of UPILEX (trademark) S having a thickness of 50 μm assuming an organic EL cell, and a back-surface protective film (diversion of the surface protective film) were laminated on the retardation layer side surface of the circularly polarizing plate of the above-mentioned laminate. The surface protective film assuming a touchscreen and the back-surface protective film used in the lamination were identical to the surface protective film laminated with the circularly polarizing plate, and the slow axes of the films were arranged to be parallel to each other.

The polarizer side surface of the circularly polarizing plate A is the TAC film surface of the laminate for PVA polarizer transfer to which the polarizer was bonded, and the retardation layer side surface thereof is the TAC film surface of the quarter-λ plate.

The polarizer side surface of the circularly polarizing plate B is the TAC film surface to which the PVA polarizer was bonded, and the retardation layer side surface thereof is the TAC film surface of the quarter-λ plate.

The polarizer side surface of the circularly polarizing plate C is the TAC film surface on which the liquid crystal polarizer was arranged, and the retardation layer side surface thereof is the TAC film surface of the quarter-λ plate.

The polarizer side surface of the circularly polarizing plate D is the polarizer surface, and the retardation layer side surface thereof is the TAC film surface of the quarter-λ plate. Immediately before the bonding of the circularly polarizing plate D to the surface protective film, the thermoplastic resin substrate of the laminate for PVA polarizer transfer was peeled off.

The polarizer side surface of the circularly polarizing plate E is the polarizer surface, and the retardation layer side surface thereof is the protective coating surface. Immediately before the bonding of the circularly polarizing plate E to the surface protective film, the thermoplastic resin substrate of the laminate for PVA polarizer transfer was peeled off, and then the biaxially stretched polyester film (A4100 manufactured by Toyobo Co., Ltd.) was peeled off.

(Bending Resistance Evaluation of Laminate of Surface Protective Film and Circularly Polarizing Plate)

Bending resistance at a bend radius of 3.0 mm was evaluated for each laminate of the surface protective film and the circularly polarizing plate in the same manner as in the evaluation of the hard coating film, sample. In the evaluation, the hard coating was positioned on the inside of the bending.

(Bendability Evaluation of Foldable Display Model)

Each obtained foldable display model was subjected to a bending resistance test by being bent 200,000 times in the same manner as in the bending resistance of the laminate with the bend radius being set to 3.0 mm. Each of the foldable display models of Examples 1 to 20 using the surface protective films 1 to 20 was found to be free of a fold mark, a crack, and the like, thereby showing excellent bending resistance.

Evaluation results are shown in Table 3.

TABLE 3

|  | Surface protective film No. | Circularly polarizing plate | Bending evaluation of laminate of surface protective film and circularly polarizing plate | Bending evaluation of foldable display model |
|---|---|---|---|---|
| Example 1A | Surface protective film 1 | A | ○ | ○ |
| Example 1B | Surface protective film 1 | B | ○ | ○ |
| Example 1C | Surface protective film 1 | C | ○ | ○ |
| Example 1D | Surface protective film 1 | D | ○ | ○ |
| Example 1E | Surface protective film 1 | E | ○ | ○ |
| Example 2A | Surface protective film 2 | A | ○ | ○ |
| Example 3A | Surface protective film 3 | A | ○ | ○ |
| Example 4A | Surface protective film 4 | A | ○ | ○ |
| Example 5A | Surface protective film 5 | A | ○ | ○ |
| Example 6A | Surface protective film 6 | A | ○ | ○ |
| Example 7A | Surface protective film 7 | A | ○ | ○ |
| Example 8A | Surface protective film 8 | A | ○ | ○ |
| Example 8B | Surface protective film 8 | B | ○ | ○ |
| Example 8C | Surface protective film 8 | C | ○ | ○ |
| Example 8D | Surface protective film 8 | D | ○ | ○ |
| Example 8E | Surface protective film 8 | E | ○ | ○ |
| Example 9A | Surface protective film 9 | A | ○ | ○ |
| Example 10A | Surface protective film 10 | A | ○ | ○ |
| Example 11A | Surface protective film 11 | A | ○ | ○ |
| Example 12A | Surface protective film 12 | A | ○ | ○ |
| Example 13A | Surface protective film 13 | A | ○ | ○ |
| Example 14A | Surface protective film 14 | A | ○ | ○ |
| Example 15A | Surface protective film 15 | A | ○ | ○ |
| Example 16A | Surface protective film 16 | A | ○ | ○ |
| Example 17A | Surface protective film 17 | A | ○ | ○ |
| Example 18A | Surface protective film 18 | A | ○ | ○ |
| Example 19A | Surface protective film 19 | A | ○ | ○ |
| Example 20A | Surface protective film 20 | A | ○ | ○ |
| Comparative Example 1A | Surface protective film 21 | A | x | — |
| Comparative Example 2A | Surface protective film 22 | A | x | — |
| Comparative Example 3A | Surface protective film 23 | A | ○ | — |
| Comparative Example 4A | Surface protective film 24 | A | ○ | — |
| Comparative Example 5A | Surface protective film 25 | A | x | — |
| Comparative Example 6A | Surface protective film 26 | A | ○ | — |
| Comparative Example 7A | Surface protective film 27 | A | ○ | — |
| Comparative Example 8A | Surface protective film 28 | A | x | — |
| Comparative Example 9A | Surface protective film 29 | A | x | — |
| Comparative Example 10A | Surface protective film 30 | A | x | — |
| Comparative Example 11A | Surface protective film 31 | A | x | — |

TABLE 3-continued

|  | Surface protective film No. | Circularly polarizing plate | Bending evaluation of laminate of surface protective film and circularly polarizing plate | Bending evaluation of foldable display model |
|---|---|---|---|---|
| Comparative Example 12A | Surface protective film 32 | A | ○ | — |
| Example 21A | Surface protective film 33 | A | ○ | ○ |

INDUSTRIAL APPLICABILITY

While maintaining mass productivity, the foldable display using the hard coating film for a foldable display of the present invention does not undergo deformation after the polyester film or the hard coating film positioned on the surface of the foldable display is repeatedly folded, and hence does not cause image distortion in the folding portion of the display. In particular, a mobile device or an image display apparatus including the foldable display of the present invention provides an beautiful image, is rich in functionality, and is excellent in convenience, such as portability.

EXPLANATION OF REFERENCE NUMERALS

1: foldable display
11: bend radius
2: polyester film for surface protective film of foldable display
21: folding portion
22: bending direction (direction orthogonal to folding portion)

The inventon claimed is:

1. A foldable display comprising at least:
a surface protective film;
a polarizer; and
a retardation layer,
wherein the surface protective film is a polyester film satisfying the following conditions and having a thickness of from 10 μm to 80 μm:

(1) a refractive index in a bending direction is from 1.590 to 1.602;
(2) a refractive index in a folding portion direction is from 1.670 to 1.700;
(3) a refractive index in a thickness direction is 1.520 or less; and
(4) a density is 1.380 g/cm$^3$ or more,
wherein the polyester film is a biaxially stretched polyethylene terephthalate film, and
wherein the bending direction refers to a direction orthogonal to a folding portion of the polyester film at a time when the polyester film is folded.

2. The foldable display according to claim 1, wherein the polyester film has an elastic modulus in the bending direction of 2.7 GPa or less, and an elastic modulus in the folding portion direction of 4.5 GPa or more.

3. The foldable display according to claim 1, further comprising a hard coating layer on at least one surface of the polyester film, wherein the hard coating layer is positioned at least on a surface of the foldable display.

4. The foldable display according to claim 3, wherein the polyester film having the hard coating layer on at least one surface thereof has a total light transmittance of 85% or more and a haze of 3% or less.

5. The foldable display according to claim 1, wherein the surface protective film is a single surface protective film continuous across a folding portion of the foldable display.

6. The foldable display according to claim 1, wherein the retardation plate is a quarter-λ plate.

7. A mobile device comprising the foldable display of claim 6.

* * * * *